United States Patent
Park et al.

(10) Patent No.: US 10,693,215 B2
(45) Date of Patent: Jun. 23, 2020

(54) ANTENNA ASSISTANT DEVICE AND ELECTRONIC DEVICE INCLUDING THE SAME

(71) Applicant: SAMSUNG ELECTRONICS CO., LTD., Suwon-si, Gyeonggi-do (KR)

(72) Inventors: Jung Sik Park, Suwon-si (KR); Seung Gil Jeon, Suwon-si (KR); Jung Su Ha, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 236 days.

(21) Appl. No.: 15/411,075

(22) Filed: Jan. 20, 2017

(65) Prior Publication Data

US 2017/0214123 A1    Jul. 27, 2017

(30) Foreign Application Priority Data

Jan. 27, 2016 (KR) .................. 10-2016-0009848

(51) Int. Cl.
*H01Q 1/24* (2006.01)
*H01P 1/203* (2006.01)
(Continued)

(52) U.S. Cl.
CPC ......... *H01Q 1/243* (2013.01); *H01P 1/20345* (2013.01); *H01Q 1/38* (2013.01);
(Continued)

(58) Field of Classification Search
CPC ........ H01Q 5/335; H05K 1/162; H05K 1/165; H03H 7/0115; H03H 2001/0078; H01F 17/00–17/0013; H01G 4/30
See application file for complete search history.

(56) References Cited

U.S. PATENT DOCUMENTS 6,911,942 B2    6/2005   Fukuda et al.
9,002,297 B2    4/2015   Chen et al.
(Continued)

FOREIGN PATENT DOCUMENTS

EP    1260998 A1    11/2002
EP    1 378 959     1/2004
(Continued)

OTHER PUBLICATIONS

Search Report and Written Opinion dated May 4, 2017 in counterpart International Patent Application No. PCT/KR2017/000615.
(Continued)

*Primary Examiner* — Ricardo I Magallanes
(74) *Attorney, Agent, or Firm* — Nixon & Vanderhye P.C.

(57) ABSTRACT

An electronic device is provided. The electronic device includes a housing, a communication circuit disposed on one side of the housing, a multi-layered printed circuit board (PCB) disposed on one side of the housing and electrically connected to the communication circuit and an antenna radiator disposed on one side of the housing or defining at least a portion of an outer surface of the housing, and is electrically connected to the communication circuit and the multi-layered printed circuit board, wherein the multi-layered printed circuit board comprises a first conductive pattern disposed in at least one of a plurality of layers thereof to form a capacitance, a second conductive pattern disposed in at least another one of the plurality of layers thereof to form an inductance and a conductive plate disposed between the at least one and the at least other one of the plurality of layers and is electrically isolated from the first conductive pattern and the second conductive pattern.

14 Claims, 31 Drawing Sheets

(51) Int. Cl.
*H01Q 5/335* (2015.01)
*H01Q 1/38* (2006.01)
*H01Q 1/48* (2006.01)
*H05K 1/16* (2006.01)
*H01G 4/30* (2006.01)
*H03H 1/00* (2006.01)

(52) U.S. Cl.
CPC ............... *H01Q 1/48* (2013.01); *H01Q 5/335* (2015.01); *H01G 4/30* (2013.01); *H03H 2001/0078* (2013.01); *H05K 1/162* (2013.01); *H05K 1/165* (2013.01); *H05K 2201/09754* (2013.01)

(56) References Cited

U.S. PATENT DOCUMENTS

| | | | |
|---|---|---|---|
| 9,236,844 B2 | 1/2016 | Feichtinger et al. | |
| 9,571,145 B2 | 2/2017 | Nagumo et al. | |
| 9,887,446 B2* | 2/2018 | Yosui | H05K 1/0216 |
| 2003/0030994 A1 | 2/2003 | Takaya et al. | |
| 2003/0063427 A1* | 4/2003 | Kunihiro | H01F 17/0006 361/277 |
| 2004/0066337 A1* | 4/2004 | Fukuda | H01P 1/213 343/700 MS |
| 2013/0027155 A1 | 1/2013 | Feichtinger et al. | |
| 2014/0128007 A1 | 5/2014 | Chen et al. | |
| 2015/0096789 A1 | 4/2015 | Kim | |
| 2015/0118984 A1 | 4/2015 | Nagumo et al. | |
| 2015/0188225 A1 | 7/2015 | Chang et al. | |
| 2016/0014903 A1* | 1/2016 | Kato | H05K 1/162 361/749 |
| 2017/0373396 A1* | 12/2017 | Kato | H01F 17/04 |
| 2018/0234073 A1* | 8/2018 | Taniguchi | H01F 17/00 |

FOREIGN PATENT DOCUMENTS

| | | |
|---|---|---|
| JP | 4097067 | 6/2008 |
| JP | 2010-103841 | 5/2010 |
| KR | 10-2006-0029827 | 4/2006 |
| KR | 10-2011-0065007 | 6/2011 |
| KR | 10-2013-0033355 | 4/2013 |

OTHER PUBLICATIONS

Extended Search Report dated Jun. 21, 2017 in counterpart European Patent Application No. 17152569.4.

European Oral Proceedings for EP Application No. 17152569.4 dated Feb. 22, 2019.

* cited by examiner

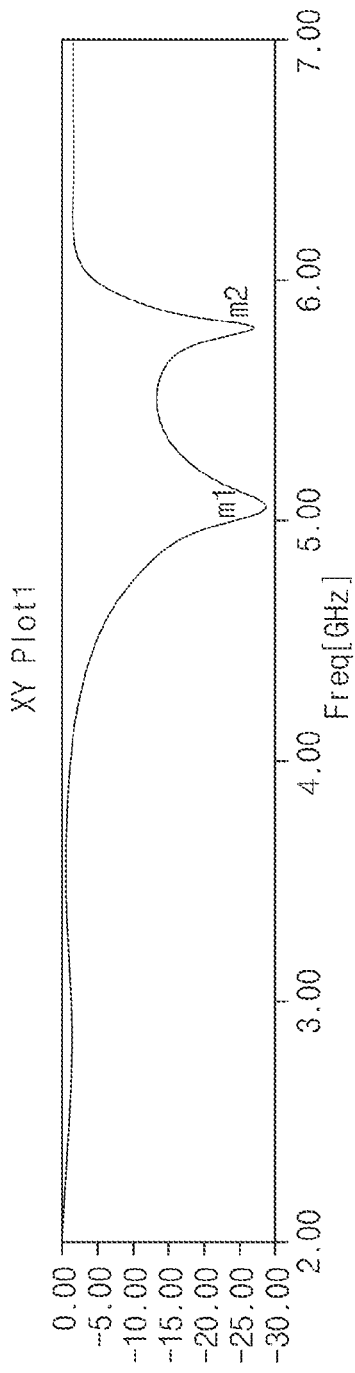
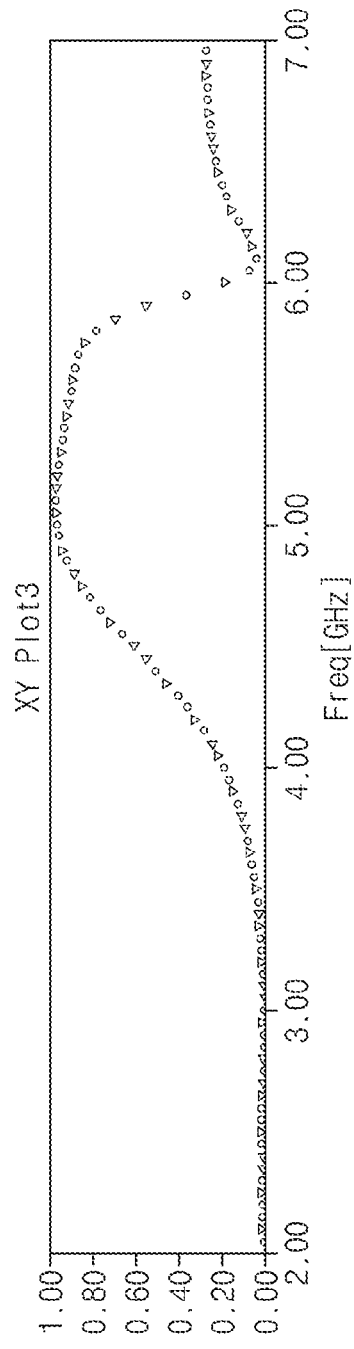
FIG. 10A
FIG. 10B

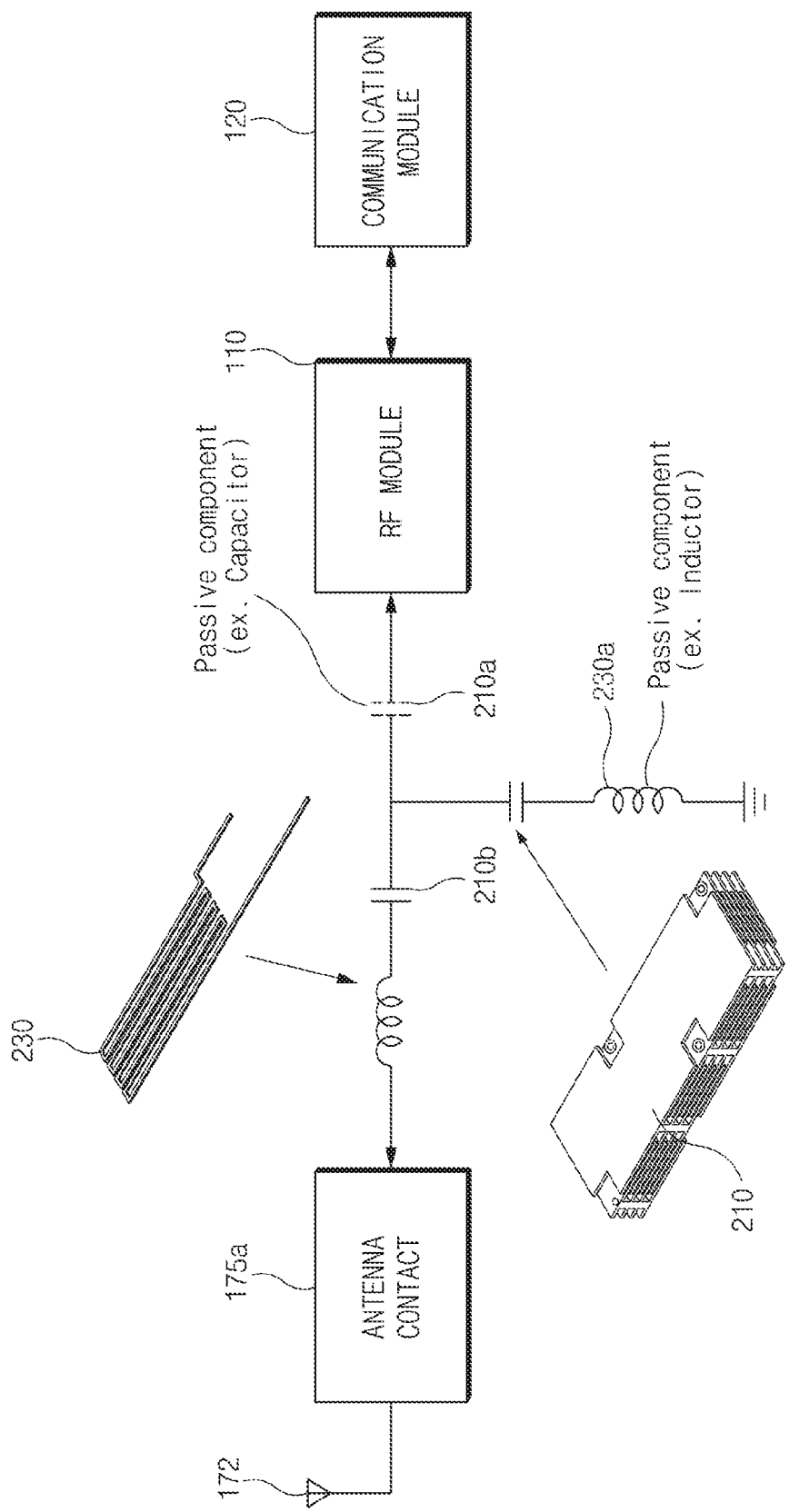

ANTENNA ASSISTANT DEVICE AND ELECTRONIC DEVICE INCLUDING THE SAME

CROSS-REFERENCE TO RELATED APPLICATION

This application is based on and claims priority under 35 U.S.C. § 119 to a Korean patent application filed on Jan. 27, 2016 in the Korean Intellectual Property Office and assigned Serial number 10-2016-0009848, the disclosure of which is incorporated by reference herein in its entirety.

TECHNICAL FIELD

The present disclosure relates generally to an antenna device.

BACKGROUND

An electronic device has a communication function. In relation to the communication function, the electronic device includes an antenna.

According to the related art, an antenna arranged in an electronic device may include various physical elements to secure the performance of an antenna and prevent static electricity introduced through the antenna. Due to the physical elements, it is difficult to make the electronic device slim.

SUMMARY

Example aspects of the present disclosure address at least the above-mentioned problems and/or disadvantages and provide at least the advantages described below. Accordingly, an example aspect of the present disclosure provides an antenna assistant device that has little spatial restriction due to a simplified structure and has a high antenna performance, and an electronic device including the same.

In accordance with an example aspect of the present disclosure, an electronic device is provided. The electronic device may include a housing, a communication circuit disposed on one side of the housing, a multi-layered printed circuit board (PCB) disposed on one side of the housing and electrically connected to the communication circuit, and an antenna radiator disposed on one side of the housing or defining at least a portion of an outer surface of the housing, and electrically connected to the communication circuit and the multi-layered printed circuit board, wherein the multi-layered printed circuit board comprises a first conductive pattern disposed in at least one of a plurality of layers thereof to form a capacitance, a second conductive pattern disposed in at least another one of the plurality of layers of the multi-layered printed circuit board to form an inductance and a conductive plate disposed between the at least one and the at least other one of the plurality of layers of the multi-layered printed circuit board and is electrically isolated from the first conductive pattern and the second conductive pattern.

In accordance with another example aspect of the present disclosure, an antenna assistant device is provided. The antenna assistant device may include a capacitor structure in which capacitor substrates are stacked, at least sides of the stacked capacitor substrates are electrically connected to an antenna, and at least opposite sides of the stacked capacitor substrates are connected to a feeder, an inductor structure disposed at a lower or upper portion of the capacitor structure, and one side of is the inductor structure being connected to the feeder and a side opposite the one side of the inductor structure being connected to a ground area and a floating metal layer that is disposed between the capacitor structure and the inductor structure.

Other aspects, advantages, and salient features of the disclosure will become apparent to those skilled in the art from the following detailed description, which, taken in conjunction with the annexed drawings, discloses various example embodiments of the present disclosure.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein:

FIGS. 10A and 10B are graphs illustrating antenna efficiencies according to an example embodiment;

FIG. 15B is a diagram illustrating another example of a transmission line of an electronic device according to an example embodiment;

Throughout the drawings, it should be noted that like reference numbers are used to depict the same or similar elements, features, and structures.

DETAILED DESCRIPTION

Figure 1A:
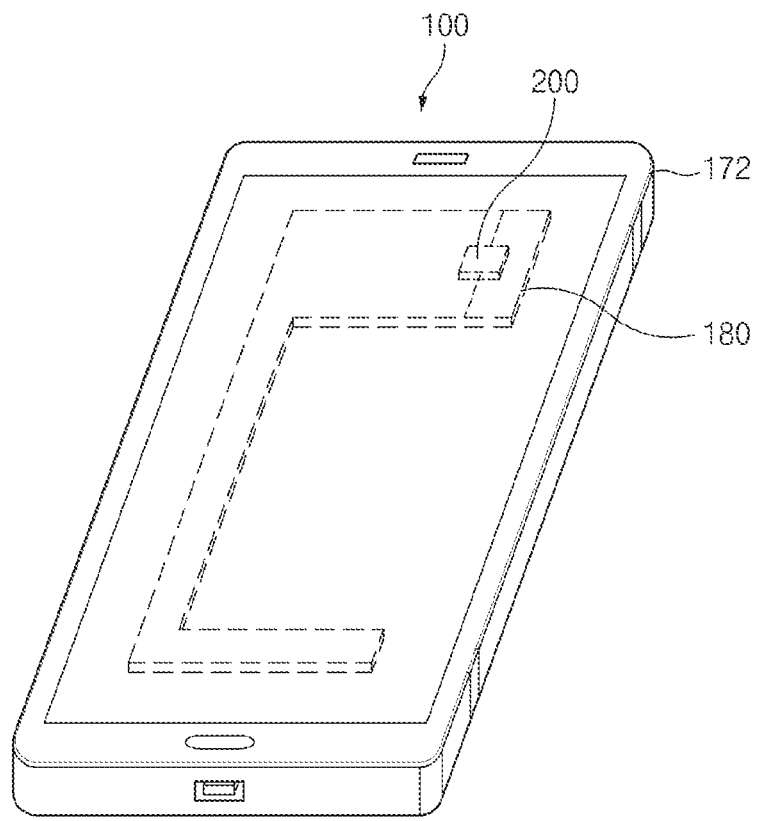
FIG. 1A is a diagram illustrating an example of an electronic device according to an example embodiment.

Various example embodiments of the present disclosure may be described with reference to accompanying drawings. Accordingly, those of ordinary skill in the art will recognize that modifications, equivalents, and/or alternatives of the various example embodiments described herein can be variously made without departing from the scope and spirit of the present disclosure. With regard to description of drawings, similar elements may be marked by similar reference numerals.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments, but do not limit the elements. Furthermore, such terms may be used to distinguish one element from another element. For example, "a first user device" and "a second user device" may indicate different user devices regardless of the order or priority thereof. For example, "a first user device" and "a second user device" indicate different user devices.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. On the other hand, when an element (e.g., a first element) is referred to as being "directly coupled with/to" or "directly connected to" another element (e.g., a second element), it should be understood that there is no intervening element (e.g., a third element).

According to the situation, the expression "configured to" used herein may be interchangeably with, for example, the expression "suitable for", "having the capacity to", "designed to", "adapted to", "made to", or "capable of". The term "configured to" does not denote or indicate only "specifically designed to" in hardware. Instead, the expression "a device configured to" may refer to a situation in which the device is "capable of" operating together with another device or other components. CPU, for example, a "processor configured to perform A, B, and C" may refer, for example, to a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Terms used in the present disclosure are used to describe various example embodiments and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal manner unless expressly so defined herein in various embodiments of the present disclosure. In some cases, even if terms are terms which are defined in the description, they may not be interpreted to exclude embodiments of the present disclosure.

An electronic device according to various example embodiments of the present disclosure may include at least one of smartphones, tablet personal computers (PCs), mobile phones, video telephones, e-book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart watches, and the like, but is not limited thereto.

According to another example embodiment, the electronic devices may be home appliances. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, or the like, but are not limited thereto.

According to another example embodiment, the electronic apparatus may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or internet of things (e.g., light bulbs, various sensors, electric or gas meters, sprinkler devices, fire alarms, thermostats, street lamps, toasters, exercise equipment, hot water tanks, heaters, boilers, and the like), or the like, but is not limited thereto.

According to another example embodiment, the electronic devices may include at least one of parts of furniture or buildings/structures, electronic boards, electronic signature receiving devices, projectors, or various measuring instruments (e.g., water meters, electricity meters, gas meters, or wave meters, and the like), or the like, but are not limited thereto. In the various embodiments, the electronic device may be one of the above-described various devices or a combination thereof. An electronic device according to an example embodiment may be a flexible device. Furthermore, an electronic device according to an example embodiment may not be limited to the above-described electronic devices and may include other electronic devices and new electronic devices according to the development of technologies.

Hereinafter, an electronic device according to the various example embodiments may be described with reference to the accompanying drawings. The term "user" used herein may refer to a person who uses an electronic device or may refer to a device (e.g., an artificial intelligence electronic device) that uses an electronic device.

Figure 1B:
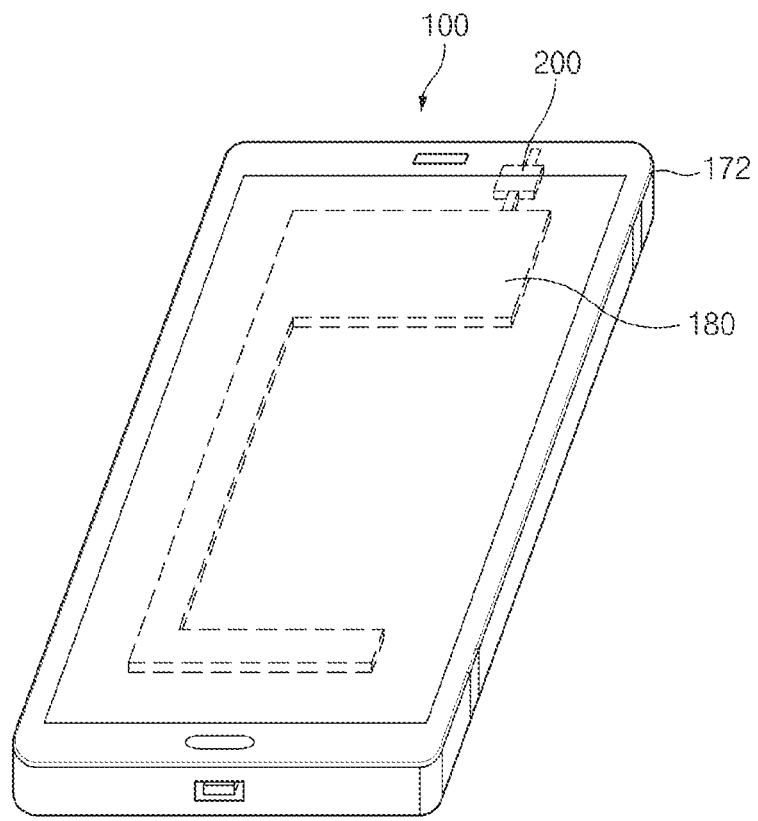
FIG. 1B is a diagram illustrating another example of an electronic device according to an example embodiment.

FIG. 1A is a diagram illustrating an example of an electronic device according to an example embodiment. FIG. 1B is a diagram illustrating another example of an electronic device according to an example embodiment.

Referring to FIG. 1A, the electronic device 100 may include a housing 172, and a printed circuit board 180, on which an antenna assistant device 200 is mounted. The electronic device 100 may further include a display. According to various example embodiments, the antenna assistant device 200 may be formed in the printed circuit board having multiple layers. For example, the antenna assistant device 200 of the electronic device 100 may be provided by forming a metal layer at a portion of the printed circuit board in a process of forming the printed circuit board 180 with a plurality of layers. Further, the antenna assistant device 200 of the electronic device 100 may be formed by partially leaving metal layers that are deposited in a process of forming the printed circuit board 180 with a plurality of layers.

Referring to FIG. 1B, the electronic device 100 may include a housing 172, a printed circuit board 180, and an antenna assistant device 200 that is connected to the printed circuit board 180 and is provided independently from the printed circuit board 180. For example, the electronic device 100 may provide the antenna assistant device 200 by using an additional printed circuit board or a flexible printed circuit board (FPCB), or the like, but is not limited thereto.

According to an example embodiment, when the antenna assistant device 200 is provided based on an additional printed circuit board, the electronic device 100 may provide the antenna assistant device 200 by arranging the partially formed metal layers between the plurality of insulation layers. When the antenna assistant device 200 is provided based on an FPCB, it may provide by depositing the antenna assistant device 200 on an FPCB film, or by forming an insulation layer and metal layers corresponding to the antenna assistant device 200 while forming an FPCB film with a plurality of layers.

The housing 172, for example, may include a side wall that surrounds at least a portion (e.g., a peripheral portion) of the display. According to various example embodiments, the housing 172 of the electronic device 100 may include a bottom that is connected to the side wall such that the elements of the electronic device 100 are seated on the bottom. At least a portion of the housing 172 may include a metal. The housing 172 may have a segmented structure in which at least a portion of the housing 172 is segmented, while surrounding a periphery of the electronic device 100. The segmented portion of the housing 172, for example, may be electrically connected to the printed circuit board 180 through the antenna assistant device 200. The metallic segmented portion of the housing 172 may function as an antenna, for example, of a communication module that is arranged in the printed circuit board 180. The term module used in connection with the capacitor module, inductor module and the like may refer, for example, to a structure of the capacitor, inductor or the like. As such, the terms module and structure may be used interchangeably herein when referring to the capacitor and inductor structures.

Various modules related to operations of the electronic device 100 may be mounted on the printed circuit board 180. For example, at least one communication module (e.g., including communication circuitry) may be mounted on the printed circuit board 180. According to an example embodiment, the printed circuit board 180 may be electrically connected to the antenna assistant device 200. For example, the printed circuit board 180 may include a feeder that sends a signal to the antenna assistant device 200, and a ground that provides a ground for the antenna assistant device 200. According to an example embodiment, the printed circuit board 180 may be arranged (or disposed) between a lower portion of the display and the bottom of the housing 172. According to various example embodiments, the printed circuit board 180 may include a wiring area in which a plurality of circuit lines are arranged (or disposed) to form multiple layers, and a fill cut area in which no circuit line is formed. At least a portion of the fill cut area, for example, may include an area in which only a dielectric layer is formed by excluding a signal line layer from a section of the printed circuit board 180. Accordingly, the electronic device 100 may restrain negligence or loss of signals due to the signal line layer, based on the fill cut area.

Chips or physical elements related to the operation of the electronic device 100 may be arranged (or disposed) on the wiring area. According to various example embodiments, the antenna assistant device 200 may be formed at at least a portion of the fill cut area. Further, the antenna assistant device 200, for example, may be arranged in the fill cut area. Further, a wring line that connects the antenna assistant device 200 and the communication module may be arranged on the fill cut area.

The antenna assistant device 200 may be arranged (or disposed) between the antenna (e.g., the housing 172) and the communication module of the printed circuit board 180 and may be used to expand a bandwidth of the antenna or to improve the filtering characteristics of the antenna. For example, the antenna assistant device 200 may provide a function of a matching element for a characteristic impedance to a transmission line of the antenna (e.g., the housing 172)

Further, the antenna assistant device 200 may provide a function to protect a circuit by interrupting a leakage current and preventing and/or reducing introduction of static electricity. For example, when a metal part (e.g., the housing 172) exposed to the outside is used as an antenna, the antenna assistant device 200 may prevent and/or reduce an electrical shock of the user by interrupting a power signal that is delivered to the metal part through the ground of the electronic device or reducing the magnitude of the power signal. Further, the antenna assistant device 200 may provide a function of an impedance matching circuit, an electric shock preventing/reducing circuit, and/or a sub resonance circuit for the antenna.

According to various example embodiments of the present disclosure, the antenna assistant device 200, for example, may include a capacitor module (e.g., comprising a capacitor structure), a floating metal, and an inductor module (e.g., including an inductor structure. According to an example embodiment, when the antenna assistant device 200 is provided based on at least a portion (e.g., at least a portion of the fill cut area) of the printed circuit board 180, a specific number of upper layers (or lower layers) of the plurality of layers, which have a metal component while a signal line layer is excluded, may be operated as a capacitor. Further, a specific number of lower layers (or upper layers) of the plurality of layers of the fill cut area having multiple layers may be operated as an inductor. Further, a specific number of intermediate layers of the plurality of layers of the fill cut area having multiple layers (a plurality of layers) may be operated as a floating metal. For example, in at least an area of the fill cut area including ten layers, eight upper layers (including the uppermost layer) with respect to the bottom of the fill cut area may be operated as a capacitor, one lower layer (or one upper layer) may be operated as an inductor, and one intermediate layer (e.g., an intermediate layer between the capacitor module and the inductor module) may be operated as a floating metal. The concentration of the metal component, the area of the extent of the area having the metal component, or the thickness of the layer having the metal component of the layers operated as the capacitor, the inductor, and the floating metal may be modified based on a design scheme.

According to various example embodiments, the capacitor module, for example, may be an embedded capacitor, and may be arranged (or disposed) on the floating metal. The inductor module, for example, may be an embedded inductor, and may be arranged under the floating metal. At least a portion of the floating metal, for example, may be formed of a metal (e.g., copper), and may have a plate shape. The floating metal may be arranged between the capacitor module and the inductor module.

The capacitor module of the antenna assistant device 200 may prevent and/or reduce an electric shock due to a current leaked from the printed circuit board 180. For example, the antenna (e.g., the housing 172) is connected to the ground of the printed circuit board 180, and if a charging operation is performed during antenna feeding, charging power is not delivered to the antenna but may be interrupted by the antenna assistant device 200 or the magnitude of the signal may be reduced.

Further, the antenna, to which the capacitor module is electrically connected, may include a first resonance circuit. Further, the capacitor module, the floating metal, and the inductor module may include a second resonance circuit. In the operation, the capacitor module, the floating metal, and the inductor module may improve the characteristic impedance of an antenna transmission line, thereby reducing reflective waves generated by the first resonance circuit and the second resonance circuit to provide a bandwidth expanding effect.

Although it has been described as an example that the housing functions as an antenna, various example embodiments are not limited thereto. For example, the electronic device 100 may further include a carrier in which an antenna corresponding to a specific communication module is arranged to have a pattern shape. Further, the electronic device 100 may further include a bracket that supports the display, and a rear cover that is coupled to the bracket, and the antenna may be arranged on one side of the rear cover in a pattern form. According to various example embodiments, the antenna assistant device 200 may be arranged between an antenna of various forms and a communication module of the printed circuit board 180 to improve the performance of the antenna and prevent and/or reduce static electricity.

Figure 2:
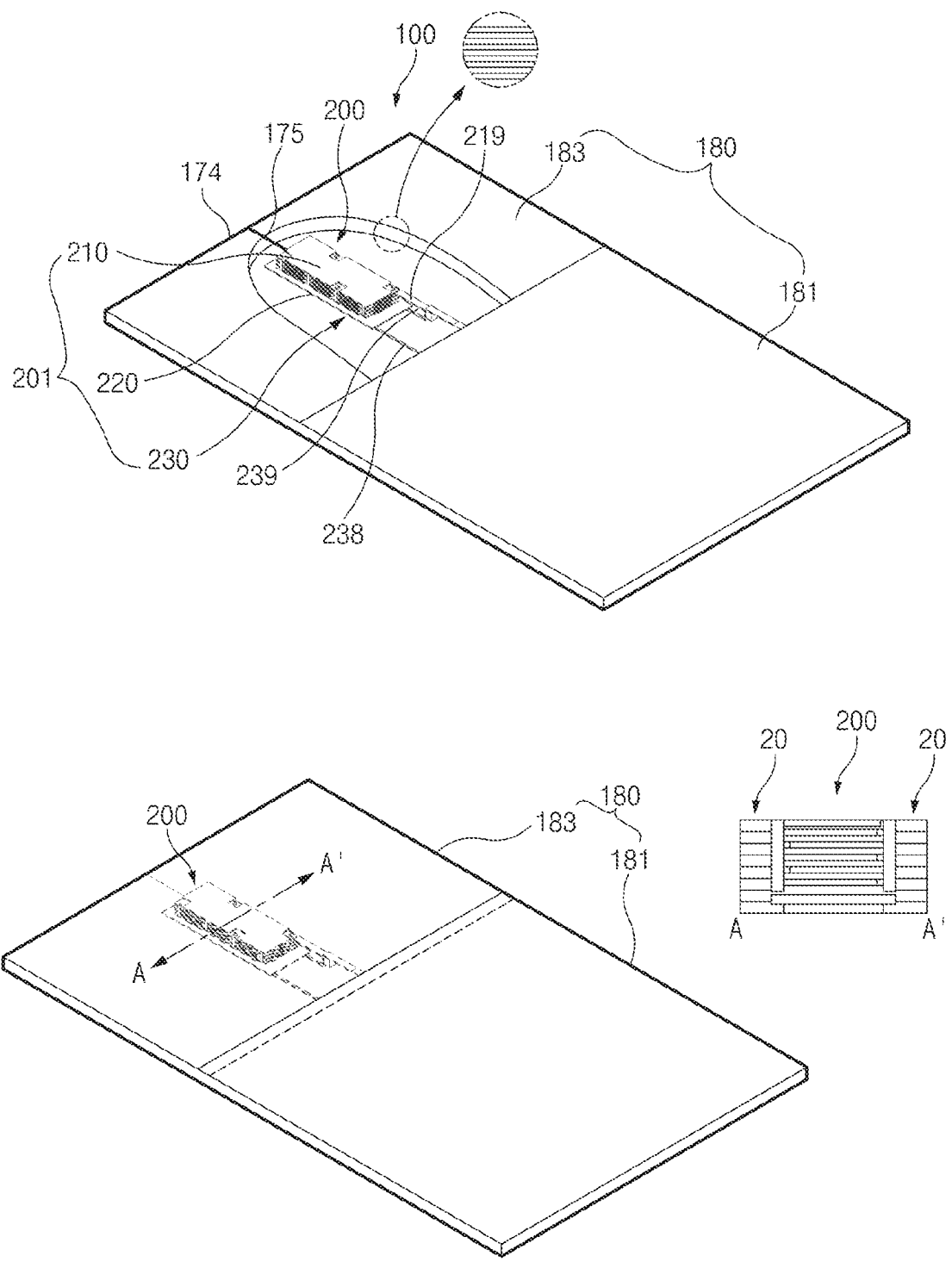
FIG. 2 is a diagram illustrating an example configuration of an electronic device related to an antenna assistant device according to an example embodiment.

FIG. 2 is a diagram illustrating an example configuration of an electronic device related to an antenna assistant device according to an example embodiment.

Referring to FIG. 2, the electronic device 100 may include a printed circuit board 180 on which the antenna assistant device 200 is mounted, and an antenna 174 (e.g., the housing 172). When the antenna assistant device 200 is mounted on the printed circuit board 180, according to an example embodiment, as at least a portion of the fill cut area of the printed circuit board 180 comprises a form of the antenna assistant device 200, the antenna assistant device 200 may be formed in the interior of the printed circuit board 180 or may be arranged in the printed circuit board 180 while not being exposed to the outside due to the insulation layer or the like. For example, as illustrated, the antenna assistant device 200 may be provided by forming some metal layers in a fill cut area 183 of the printed circuit board 180, in which no metal layer is formed. Accordingly, along cutting line A-A', the antenna assistant device 200 may be arranged between the areas 20 which correspond to the fill cut area 183 and in which no metal layer is formed. Further, according to various example embodiments, the electronic device 100 may include an antenna assistant device 200 that is provided independently from the printed circuit board 180.

The printed circuit board 180, for example, may include a wiring area 181 and a fill cut area 183. The wiring area 181, for example, may include an area in which an insulation layer (e.g., PPG (Prepreg)) and a plurality of wiring layers are stacked. The fill cut area 183, for example, may include an area in which a plurality of insulation layers is stacked. According to various example embodiments, an area in which a wiring layer is excluded when the printed circuit board 180 is formed may be a fill cut area 183. At least one communication module may be arranged in the wiring area 181. An antenna assistant device 200 that is electrically connected to the communication module may be arranged in the fill cut area 183.

The antenna assistant device 200 may include an antenna assistant circuit 201, feeding lines 219 and 239, a ground line 238, and an antenna assistant line 175. According to various embodiments, when the antenna assistant circuit 201 is formed in the printed circuit board 180, at least one of the feeding lines 219 and 239, the ground line 238, and the antenna assistant line 175 may be formed in the printed circuit board 180 in a pattern to be connected to the antenna assistant circuit 201.

The antenna assistant circuit 201 may include a capacitor module 210, a floating metal layer 220 (or a floating metal), and an inductor module 230. For example, the antenna assistant circuit 201 may include a capacitor module 210 that includes overlapping layers in an area of the fill cut area of the printed circuit board 180, an inductor module 230 that includes layers of the remaining area of the fill cut area, and a floating metal layer 220 that is arranged between the capacitor module 210 and the inductor 230. Further, the antenna assistant circuit 201 may be configured such that the capacitor module 210, the floating metal layer 220, and the inductor module 230 are separately provided to be arranged on the printed circuit board 180.

The capacitor structure 210 may include a plurality of stacked layers. Each of the plurality of layers may include a layer formed of a conductive material, and the layers may be vertically spaced apart from each other while the insulation layers are interposed between them. At least some of the plurality of layers may be electrically connected to each other (e.g., through a via hole that vertically passes through the some layers). As the plurality of layers includes conductive layers, the capacitor module 210 may be used as a capacitor. The inductor structure 230 may include a wire that is wound or arranged in zigzags. The floating metal layer 220, for example, may be arranged between one surface of the capacitor module 210 and the inductor module 230 to prevent and/or reduce direct coupling between the capacitor module 210 and the inductor module 230. The floating metal layer 220, for example, may be formed of a metal (e.g., copper). The feeding lines 219 and 239, for example, may electrically connect the antenna assistant circuit 201 and the feeder of the printed circuit board 180. For example, the feeding lines 219 and 239 may electrically connect the feeder of the printed circuit board 180, and one side of the capacitor module 210 and one side of the inductor module 230. The ground line 238 may electrically connect the antenna assistant circuit 201 and the ground of the printed circuit board 180. For example, the ground line 238 may connect one side of the inductor module 230 and the ground area of the printed circuit board 180. The antenna assistant line 175, for example, may include various structures that are electrically connected to the antenna assistant device 200 to electrically connect the antenna assistant device 200 to the antenna (e.g., the housing 172). For example, the antenna assistant line 175 may have a C-clip shape such that one side thereof is connected to the antenna assistant device 200 and an opposite side thereof is connected to the antenna. According to various example embodiments, the antenna assistant line 175 may be provided in a form such as a pattern or an electrical line, and may electrically connect the antenna 174 and the antenna assistant circuit 201. For example, the antenna assistant line 175 may electrically connect one side of the antenna 174 and one side of the capacitor module 210.

According to various example embodiments, the antenna assistant line 175 extends the pattern of the antenna to the printed circuit board, and when the antenna pattern is short in relation to a spatial restriction of the electronic device, the electronic device may further include a pattern that is additionally provided to compensate for a disadvantage due to use of the short antenna pattern during transmission and reception of signals. The antenna may be an exposed portion of the housing (or the case) of the electronic device, and the antenna assistant line 175 may include a pattern that connects the antenna assistant circuit 201 to the antenna.

The antenna 174, for example, may be formed by using a pattern on one side of the printed circuit board 180. According to an example embodiment, the antenna 174 may be arranged on one side of the fill cut area 183 of the printed circuit board 180. The antenna 174 may be connected to the antenna assistant circuit 201 (e.g., the capacitor module 210) through the antenna assistant line 175. The length of the antenna 174 may vary based on the size of a targeted frequency band. Further, the antenna 174 may include at least one physical element (e.g., a capacitor or an inductor).

Figure 3:
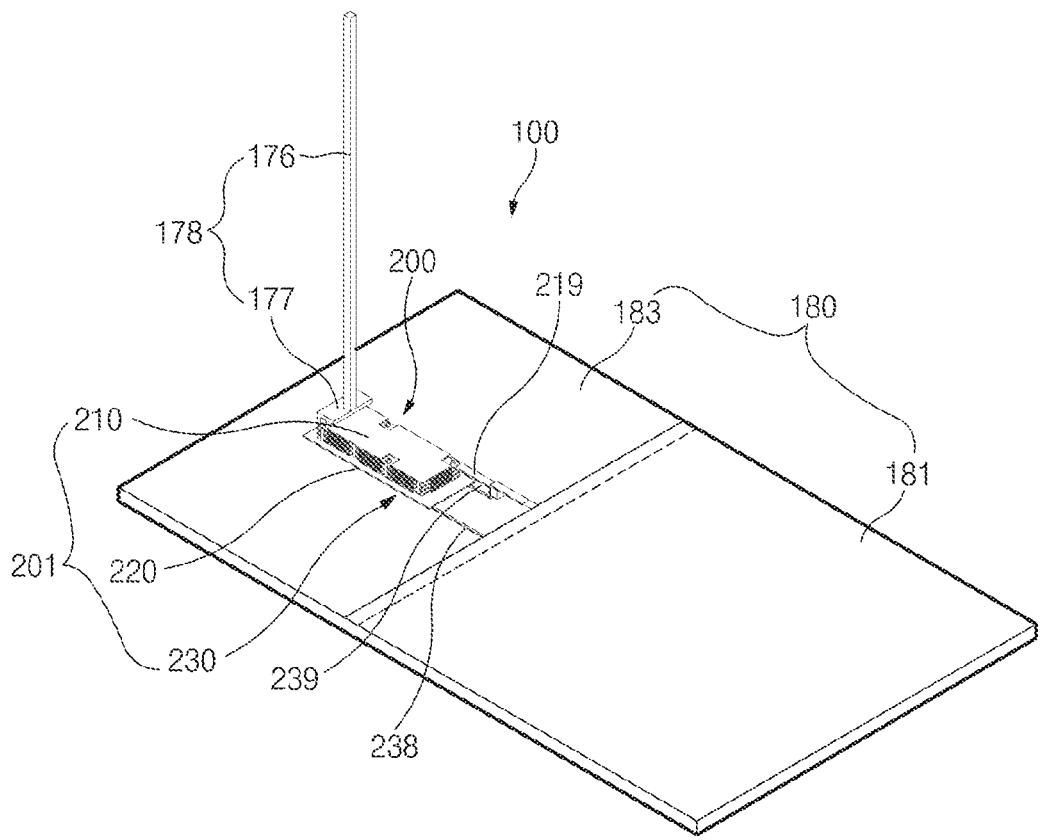
FIG. 3 is a diagram illustrating another example configuration of an electronic device related to an antenna assistant device according to an example embodiment.

FIG. 3 is a diagram illustrating another example configuration of an electronic device related to an antenna assistant device according to an example embodiment.

Referring to FIG. 3, a configuration of the electronic device, for example, may include an antenna assistant device 200, a printed circuit board 180, or an antenna device 178. The drawing illustrates as an example that the antenna assistant device 200 is separately provided on the printed circuit board 180. The antenna assistant device 200 may be configured such that some metal layers are arranged between a plurality of insulation layers in the interior of the printed circuit board 180.

The printed circuit board 180 may include a wiring area 181 and a fill cut area 183. A ground area or a feeder may be arranged in the wiring area 181. The antenna assistant device 200 may be arranged in the fill cut area 183.

The antenna assistant device 200 may include an antenna assistant circuit 201, feeding lines 219 and 239, and a ground line 283. The antenna assistant circuit 201 may include a capacitor module 210, a floating metal layer 220, and an inductor module 230. As described above, for example, the antenna assistant circuit 201 may be provided based on at least a portion of the fill cut area of the printed circuit board 180. Further, the antenna assistant circuit 201 may be provided as a separate structure, and may be arranged on the printed circuit board 180. In this case, the inductor module 230 may face the fill cut area 183. A floating metal layer 220 is arranged on the inductor module 230, and a capacitor module 210 may be arranged on the floating metal layer 220. The capacitor module 210 may include a structure in which a plurality of capacitor substrates is stacked.

The antenna device 178, for example, may include an antenna connector 177 and an antenna 176. The antenna connector 177 may electrically connect the antenna 176 and the antenna assistant circuit 201 of the antenna assistant device 200. According to an example embodiment, the antenna connector 177 may be a C-clip. The clip type antenna connector 177 may be configured such that a joining member is joined (e.g., soldered) to one side of the capacitor module 210. An opposite side of the clip type antenna connector 177 may be connected to the antenna 176. The antenna 176, for example, may transmit and receive signals of a specific device included in the electronic device 100. According to an example embodiment, the antenna 176 may be an antenna that receives a multimedia broadcasting signal. Further, the antenna 176 may be an antenna that transmits and receives a signal based on short range wireless communication (e.g., Bluetooth communication, NFC, MST communication, or Wi-Fi communication). Although the drawing illustrates that the antenna 176 is arranged perpendicularly to the fill cut area 183 through the antenna connector 177, various embodiments are not limited thereto.

The antenna 176, for example, may be arranged on one side of the housing of the electronic device 100 or as a separate pattern.

Figure 4A:
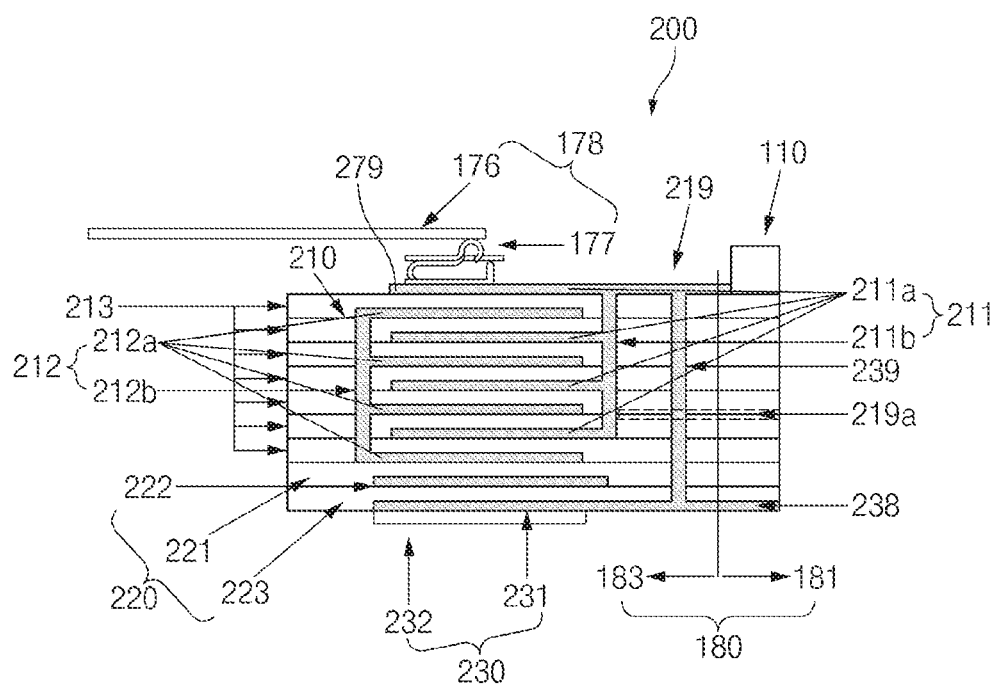
FIG. 4A is a diagram illustrating an example section of an area of a printed circuit board according to an example embodiment.

FIG. 4A is a diagram illustrating a section of an area of a printed circuit board according to an example embodiment.

Referring to FIG. 4A, the antenna assistant device 200 may be arranged in the fill cut area 183 of the area of the printed circuit board 180, and an RF module 110 may be arranged on one side of the wiring area 181. The antenna assistant device 200 is visually observed as an area of the printed circuit board 180, and may be represented as in a form illustrated in FIG. 4A when being cut in the stacking direction. The antenna assistant device 200 may be implemented in the layers of the interior of the printed circuit board 180 by at least some of the conductive patterns.

One side of the feeding line 219 may be connected to the RF module 110 arranged in the printed circuit board 180, and an opposite side of the first feeding line 219 may be connected to the capacitor module 210. According to various example embodiments, a plurality of first feeding lines 219 may be provided. For example, as illustrated, the auxiliary feeding line 219a may be electrically connected to a specific layer of the capacitor module 210 or a first capacitor stack 211 and the RF module 110. The auxiliary feeding line 219a, for example, may be formed on a printed circuit board layer that is different from the first feeding line 219. When a plurality of auxiliary feeding lines 219a are electrically connected to the first feeding line 219, a line impedance of the first feeding line 219 may decrease, and when the first feeding line 219 and the auxiliary feeding line 219a are electrically isolated from each other such that another signal may be transmitted, at least one antenna assistant device 200 may be used in common to reduce an additional mounting space due to the antenna assistant device 200.

Further, one side of the second feeding line 239 may be connected to the inductor module 230, and an opposite side of the second feeding line 239 may be connected to the RF module 110 arranged in the printed circuit board 180. One side of the ground line 238 may be connected to the inductor module 230, and an opposite side of the ground line 238 may be connected to a ground layer located in the printed circuit board 180.

The antenna assistant device 200, for example, may include a capacitor module 210, a floating metal layer 220, and an inductor module 230. The capacitor module 210 may include a first capacitor stack 211, a second capacitor stack 212, and a plurality of insulation layers 213. According to an example embodiment, the first capacitor stack 211 and the second capacitor stack 212 may include a plurality of capacitor substrates 212a and 211a and columns 211b and 212b. The columns 211b and 212b may electrically connect sides of the capacitor substrates 212a and 211a. For example, the column 211b may electrically connect the first capacitor substrates 211a through a via hole that vertically passes through the first capacitor substrates 211a. The column 212b may electrically connect the second capacitor substrates 212a through a via hole that vertically passes through the second capacitor substrates 212a.

The plurality of capacitor substrates 211a of the first capacitor stack 211 may be stacked while being spaced apart from each other at a specific gap. At least some of the capacitor substrates 212a of the second capacitor stack 212 may be arranged between the plurality of capacitor substrate 211a of the first capacitor stack 211 to overlap each other. The insulation layers 213 may be arranged between the plurality of capacitor substrate 211a of the first capacitor stack 211 and the plurality of capacitor substrate 212a of the first capacitor stack 212. The floating metal layer 220 may be arranged under the lowermost plate of the capacitor module 210, for example, under the lowermost plate of the second capacitor stack 212. The antenna device 178 may be arranged on the uppermost plate of the capacitor module 210, for example, on the uppermost plate of the first capacitor stack 211.

The floating metal layer 220, for example, may include at least some of the upper insulation layer 221, the floating substrate 222 (e.g., the floating layer or the floating metal), and the lower insulation layer 223 (at least including the floating substrate 222). The floating metal layer 220 may be arranged between the capacitor module 210 located on (or under) the floating metal layer 220 and the inductor module 230 located under (or on) the floating metal layer 220 while being electrically floated. The floating metal layer 220 may be connected neither to the feeding lines 219 and 239 nor to the ground line 238 but may be arranged independently.

The upper insulation layer 221, for example, electrically insulates the capacitor module 210 and the floating substrate 222. Further, the lower insulation layer 223 may be insulated such that the floating substrate 222 and the inductor module 230 are not electrically connected to each other. The floating metal layer 220, for example, may at least partially interrupt an electrical connection state or an electrical coupling state between the capacitor module 210 and the inductor module 230. The floating metal layer 220 may be used as a configuration of a resonance circuit of the module (the capacitor module 210 or the inductor module 230). The extent and thickness of the floating metal layer may be various based on the magnitude of the capacitance of the capacitor module 210 or the magnitude of the inductance of the inductor module 230. According to an example embodiment, when the capacitor module 210 or the inductor module 230 having a capacitance or an inductance corresponding to a first magnitude is arranged, the floating metal layer 220 may have a surface that is larger than the bottom surface of the capacitor module. When the capacitor module 210 or the inductor module 230 having a capacitance or an inductance corresponding to a second magnitude is arranged, the floating metal layer 220 may have a surface that is smaller than the bottom surface of the capacitor module. When the capacitor module 210 or the inductor module 230 having a capacitance or an inductance corresponding to a third magnitude is arranged, the floating metal layer 220 may have a surface that is the same as or similar to the bottom surface of the capacitor module.

The inductor module 230 may be arranged at a lower portion of the floating metal layer (e.g., the lower insulation layer 223). One side of the inductor module 230 may be connected to the RF module 110 through the second feeding line 239. Further, an opposite side of the inductor module 230 may be electrically connected to a ground area (not illustrated) of the printed circuit board 180 through the ground line 238. The arrangement structure of the floating metal layer 220, the capacitor module 210, and the inductor module 230 may function as a resonance circuit for a specific frequency band. The inductor module 230, for example, may include an inductor 231 and a second bonding layer 232. The second bonding layer 232, for example, may be formed of a nonconductive material. The second bonding layer 232 may be a component that may connect the antenna assistant device 200 to the outside, a conductive tape, or a C-clip.

The antenna device 178, for example, may include an antenna connector 177 and an antenna 176. The antenna connector 177, for example, may include a C-clip. The antenna connector 177 is formed of a metal, and may be electrically connected to one side of the capacitor module 210.

Figure 4B:
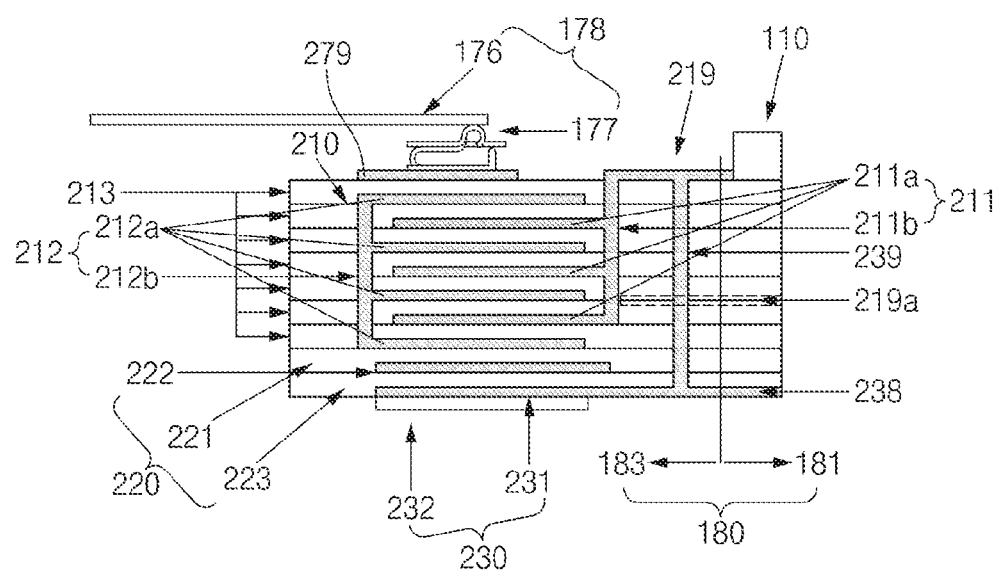
FIG. 4B is a diagram illustrating another example form of a section of an area of a printed circuit board according to an example embodiment.

FIG. 4B is a diagram illustrating another example form of a section of an area of a printed circuit board according to an example embodiment.

Referring to FIG. 4B, the antenna assistant device 200 may be formed in the interior of an area of the printed circuit board 180. At least some of the metal layers may be patterned in an operation of forming the printed circuit board 180 such that the antenna assistant device 200 may include a capacitor module 210, an inductor module 230, and a floating metal layer 220. Here, the insulation layer 213 may be arranged between the stacked capacitor modules 210. The insulation layer 213 may be also arranged in the fill cut area 183. The spaces between the insulation layers are removed in a process of pressing the printed circuit board 180 such that the insulation layers contact each other. The capacitor module 210 and the inductor module 230 may be vertically symmetrical to each other with respect to the floating metal layer 220. The antenna connector 177 may be arranged on the uppermost layer of the capacitor module 210, for example, on an uppermost portion of the antenna assisting device 200.

The floating metal layer 220, for example, may include at least some of the upper insulation layer 221, the floating substrate 222, and the lower insulation layer 223 (at least including the floating substrate 222). The floating metal layer 220 may be arranged between the capacitor module 210 located on (or under) the floating metal layer 220 and the inductor module 230 located under (or on) the floating metal layer 220 while being floated. The floating metal layer 220 may be connected neither to the feeding lines 219 and 239 nor to the ground line 238 but may be arranged independently.

The capacitor module 210 may include a first capacitor stack 211, a second capacitor stack 212, and a plurality of insulation layers 213. According to an example embodiment, the first capacitor stack 211 and the second capacitor stack 212 may include a plurality of capacitor substrates 211a and 212a and columns 211b and 212b. The columns 211b and 212b may electrically connect the capacitor substrates 211a and 212a through the via hole formed in the capacitor substrates 211a and 212a. The first capacitor substrates 211a and the second capacitor substrates 212a are alternately arranged, and at least some of the first capacitor substrates 211a and the second capacitor substrates 212a may be arranged to vertically overlap each other while the insulation layers 213 are interposed between them. The illustrated capacitor module 210 has a structure in which the uppermost layer of the second capacitor substrates 212a is arranged above the uppermost layer of the first capacitor substrates 211a. According to various example embodiments, the uppermost layer of the second capacitor substrates 212a may be electrically connected to the first bonding layer 279.

The antenna device 178, for example, may include an antenna connector 177, an antenna 176, and a first bonding layer 279. The first bonding layer 279 may fix the antenna connector 177 to the capacitor module 210. Accordingly, the first bonding layer 279 may electrically connect the capacitor module 210 and the antenna connector 177. The first bonding layer 279, for example, may include a conductive tape or a soldering structure. Further, the first bonding layer 279 may be formed as at least a portion of the conductive layer arranged in the uppermost layer of the capacitor module 210. For example, if the uppermost layer (e.g., an insulation film) of the printed circuit board 180 is removed, the first bonding layer 279, for example, may include a part at which the metal layer (e.g., the metal layer provided in the fill cut area in relation to the antenna assistant device 200) arranged under the uppermost layer. Solder is applied onto the first bonding layer 279, and the first bonding layer 279 may electrically contact the antenna device 178. Further, the first bonding layer 279 may include a hook structure. The antenna connector 177, for example, may include a C-clip. One side of the antenna connector 177 of a C-clip may be electrically connected to the capacitor module 210 through the first bonding layer 279. An opposite side of the clip type antenna connector 177 may be connected to the antenna 176. The first bonding layer 279 may be formed in the printed circuit board 180 and may be formed in a layer that is separate from the antenna assistant device 200 to couple an electrical signal generated by the antenna assistant device 200 and deliver the coupled electrical signal to the antenna connector 177. Although the capacitance of the capacitor module 210 is reduced as compared with a situation in which a feeding signal is directly delivered from the first feeding line 219, distortion of the resonance of the antenna may be prevented when the antenna 176 contacts the body of a user.

Figure 5:
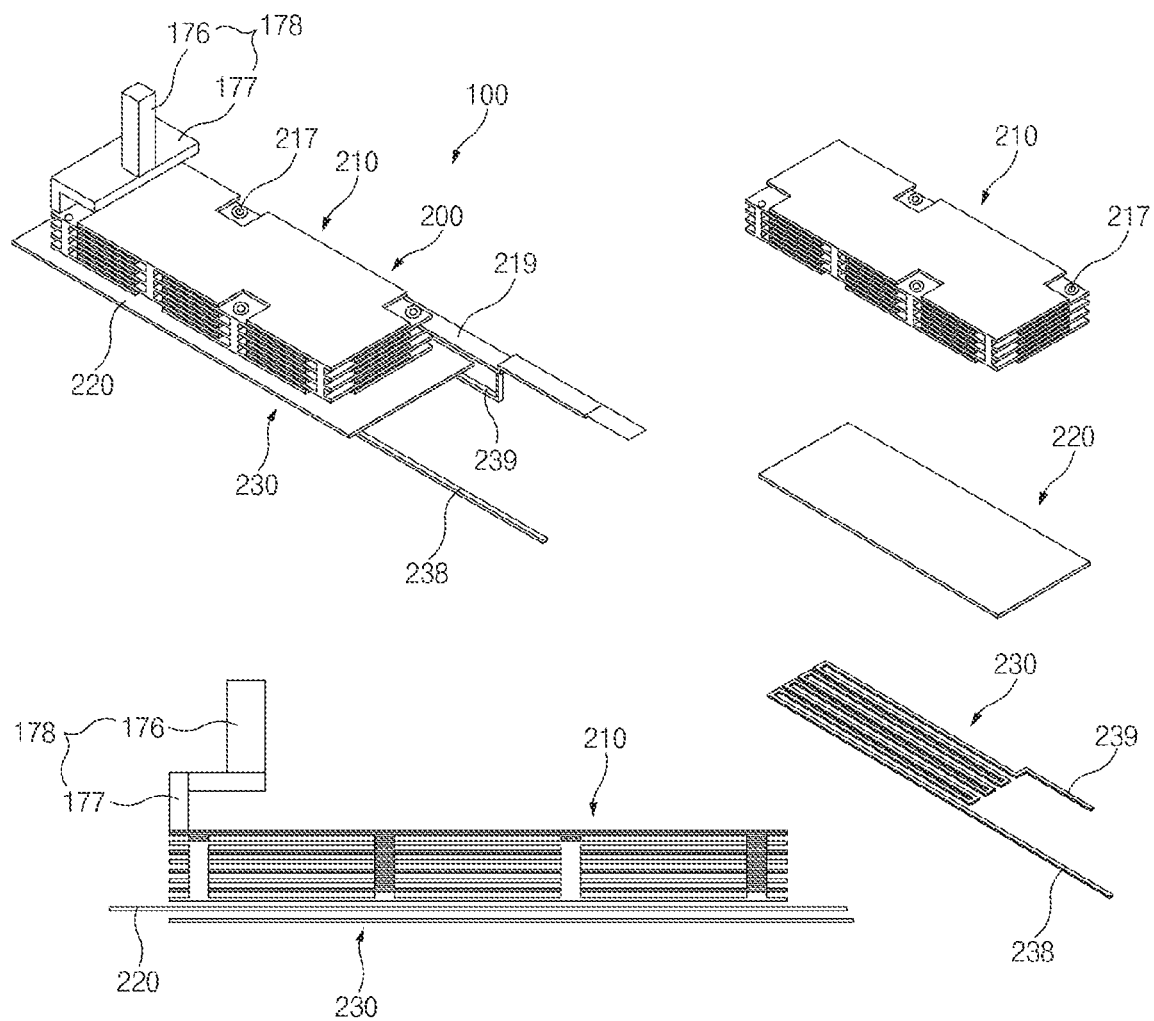
FIG. 5 is an exploded perspective view of a part of an example electronic device including an antenna assistant device according to an example embodiment.
Figure 6:
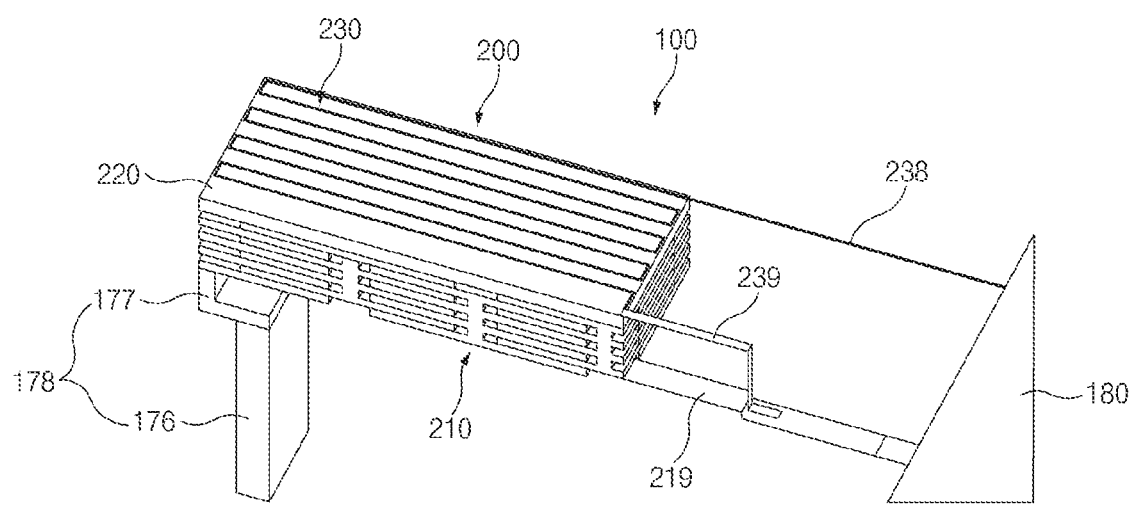
FIG. 6 is a rear perspective view of a part of an example electronic device including an antenna assistant device according to an example embodiment.

FIG. 5 is an exploded perspective view of a part of an example electronic device including an antenna assistant device according to an example embodiment. FIG. 6 is a rear perspective view of a part of an example electronic device including an antenna assistant device according to an example embodiment.

Referring to FIGS. 5 and 6, the electronic device 100 may include a printed circuit board 180, an antenna assistant device 200, and an antenna device 178. The antenna assistant device 200 may include a capacitor module 210, a floating metal layer 220, and an inductor module 230. Although not illustrated in FIGS. 5 and 6, as described in FIG. 4, insulation layers are arranged between the capacitor substrates of the capacitor module 210 such that the capacitor substrates are not directly connected to each other (e.g., insulated).

The antenna device 178, for example, may include an antenna connector 177 and an antenna 176. The antenna 176 may be electrically connected to the antenna connector 177. The antenna connector 177 also may be electrically connected to one side of the capacitor module 210.

The capacitor module 210 may have a shape in which the plurality of capacitor substrates included in the first capacitor stack 211 and the plurality of capacitor substrates included in the second capacitor stack 212 alternately overlap each other. Here, the first capacitor stack 211 may include a column 217 (e.g., the first column 211b of FIG. 4A or 4B) that is provided in a form of a via hole that vertically passes through the first capacitor substrates to electrically connect the first capacitor substrates. Further, the second capacitor stack 212 may include a column 217 (e.g., the second column 212b of FIG. 4A or 4B) that is provided in a form of a via hole that vertically passes through the second capacitor substrates to electrically connect the second capacitor substrates.

As illustrated, the capacitor module 210 may have a shape that is obtained by cutting portions of a rectangular shape. A via hole 217 that electrically connects the capacitor substrates of the vertically arranged capacitor substrates, which pertain to the same capacitor stack (e.g., the first capacitor stack 211 or the second capacitor stack 212) may be arranged in the cut area. For example, a plurality of via holes 217 may be arranged. The capacitor module 210 may be connected to the antenna 176 through the antenna connector 177. The capacitor module 210 connected to the antenna 176 may comprise a resonance circuit corresponding to a main resonance frequency band. The main resonance frequency band may vary based on the characteristics of the targeted communication module. The capacitor module 210 (e.g., the uppermost layer of the second capacitor stack 212) may be connected to the feeder of the printed circuit board 180 through the first feeding line 219.

The floating metal layer 220, for example, may be arranged between the capacitor module 210 and the inductor module 230. An insulation layer may be arranged between the floating metal layer 220 and the inductor module 230. The floating metal layer 220 and the inductor module 230, for example, may comprise a resonance circuit corresponding to a sub resonance frequency band. The sub resonance frequency band may vary based on the characteristics of the communication module. When the floating metal layer 220 is removed from between the capacitor module 210 and the inductor module 230, the inductor module 230 functions as one plate having an area and acts as a portion of a capacitor. As a result, the antenna assistant device 200, from which the floating metal layer 220 is excluded, may be operated only as an input matching circuit due to the lowered impedance. For example, the value L of the sub resonance frequency f0 may become lower.

The inductor module 230 may include a plurality of lines that are arranged under the floating metal layer 220 in zigzags. According to various embodiments, the inductor module 230 may have a shape in which a plurality of zigzag arrangements of different directions is provided. The start line of the inductor module 230, for example, may be connected to the second feeding line 239 connected to the feeder of the printed circuit board 180. Further, the end line of the inductor module 230, for example, may be connected to the ground line 238 connected to the ground area of the printed circuit board 222. According to various embodiments, the second feeding line 239 and the ground line 238, for example, may be provided such that the start line and the end line of the inductor module 230 are changed. The feeder and the ground area may be arranged in the wiring area 181 of the printed circuit board 180.

The above-described shape of the capacitor substrates of the capacitor module 210 is simply an example embodiment, and the capacitor substrates may have various shapes. For example, the capacitor substrates of the capacitor module 210 may have a circular shape, an elliptical shape, or a polygonal shape. Further, the capacitor substrates may have curved surfaces including at least one free curve or line. For example, the capacitor substrates may have an yin-yang pattern or a fylfot shape. When the capacitor substrates have various shapes, the floating metal layer 220 may have a shape corresponding to the shape of the substrates of the capacitor module 210. For example, when the capacitor substrates are elliptical, the floating metal layer 220 may include a substrate that has an area that is larger than those of the capacitor substrates (or smaller than or equal to those of the capacitor substrates). When the capacitor substrates have a closed curved surface including a free curve or a line, the floating metal layer 220 may have surface that may cover the whole closed curved surface. The shape of the inductor module 230 may have various shapes in correspondence to the shape of the capacitor module 210 or the floating metal layer 220. For example, the inductor module 230 may have a spirally wound shape, a circularly wound shape, or a shape that is arranged in zigzags forwards, rearwards, leftwards, and rightwards. The inductor module 230 may be provided to have an area that is larger than the whole area of the floating metal layer 220 (or smaller than or equal to the whole area of the floating metal layer 220).

Figure 7:
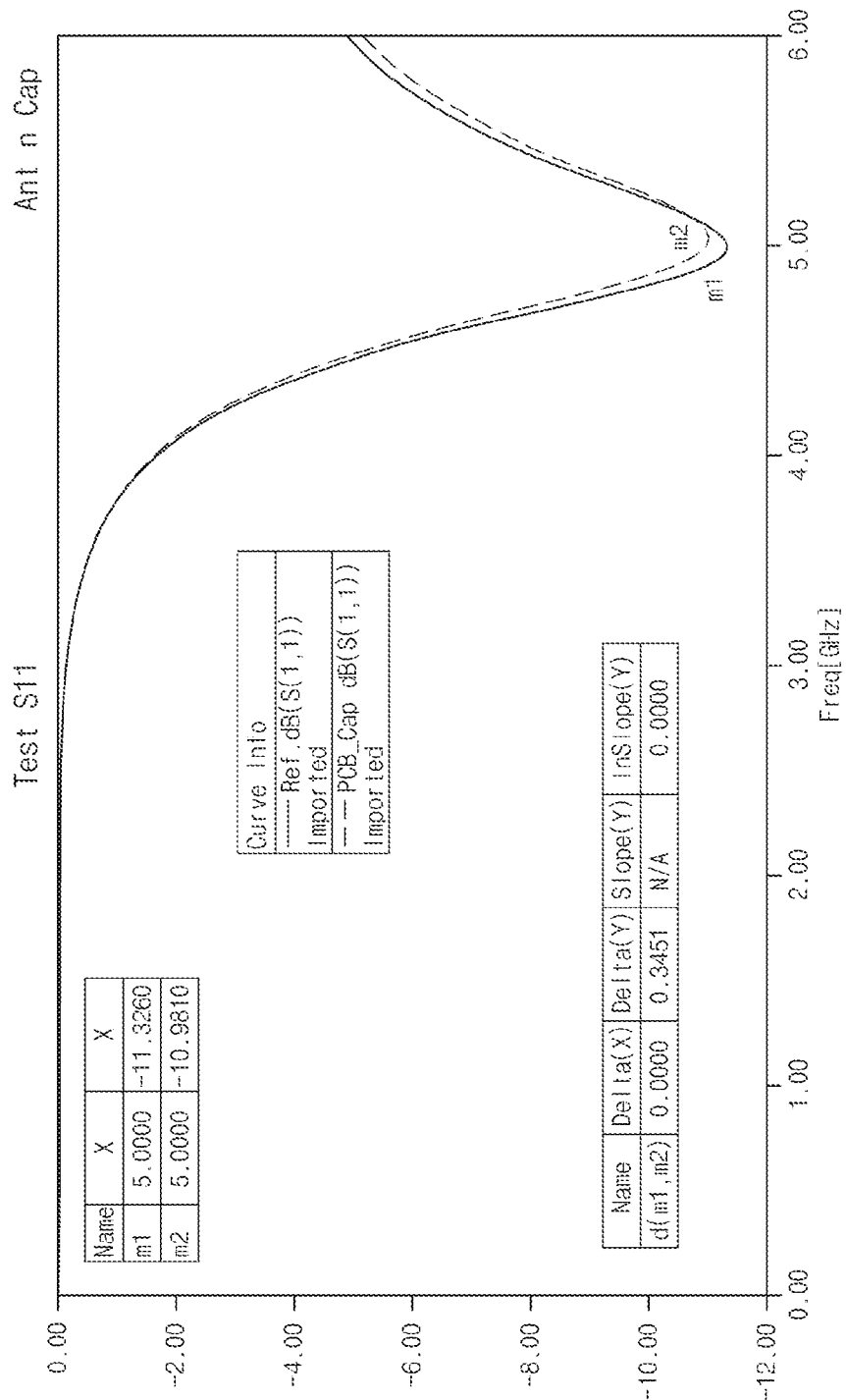
FIG. 7 is a graph illustrating characteristics of an antenna, to which an example antenna assistant device is applied, according to an example embodiment.

FIG. 7 is a graph illustrating characteristics of an antenna, to which an antenna assistant device is applied, according to an example embodiment.

Referring to FIG. 7, m1 represents signal output characteristics when the electronic device 100 include only an antenna, and m2 represents signal output characteristics in a form in which an antenna and an antenna assistant device 200 are arranged. Referring to graph S11 (a characteristic graph for comparing return signals of output signals) of the antenna, to which the above-described antenna assistant device is mounted), it can be seen that the electronic device shows very excellent resonance frequency characteristics at a band of 5 GHz.

Figure 8A:
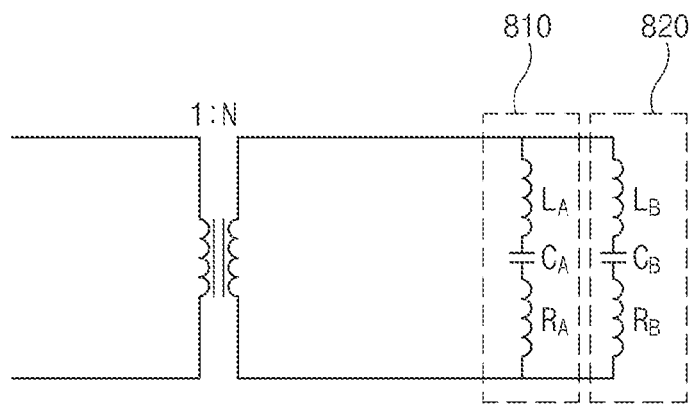
FIGS. 8A and 8B are diagrams illustrating an equivalent circuit of an antenna, to which an example antenna assistant device is applied, according to an example embodiment.

FIG. 8A is a diagram illustrating an equivalent circuit of an antenna, to which an antenna assistant device is applied, according to an example embodiment.

As the antenna is provided in a form of a wire having a length, it may have an equivalent circuit including a resistance component R1, L1, C1, and R1 are components of an equivalent of the antenna, and L2 may means an inductance component that is applied by the lengths of the embedded capacitor module, the inductor module, and the embedded elements designed according to an example embodiment of the present disclosure. L1, C1, and R1, and L2, C2, and R2 may be electrically connected to each other, and accordingly, may influence impedance matching and resonance frequencies while influencing each other. Accordingly, because the antenna and the antenna assistant device 200 substantially electrically influence each other, the first equivalent circuit 810, for example, may become an equivalent circuit corresponding to a frequency band at which the antenna is main, and the second equivalent circuit 820, for example, may become an equivalent circuit corresponding to a frequency band at which the antenna assistant device 200 is main.

Referring to FIG. 8A, the equivalent circuit of the antenna, to which the antenna assistant device is applied, may include a first equivalent circuit 810 and a second equivalent circuit 820. The first equivalent circuit 810, for example, may include a first capacitor C1, a first inductor L1, and a first resistor R1. The first capacitor C1, the first inductor L1, and the first resistor R1 may have values corresponding to a physical element of the antenna (e.g., the housing 172 or the antenna 174 or 176) and the inductor or the capacitor arranged in the antenna. The first equivalent circuit 810 may be an equivalent circuit corresponding to a frequency band operated based on the floating metal arranged between the capacitor module and the inductor module. The second equivalent circuit 820 may include equivalent circuit values, such as the values of the second capacitor C2, the second inductor L2, and the second resistor R2, which corresponds to the capacitor module, the inductor module, and the floating metal arranged in the antenna assistant circuit.

According to various example embodiments, the value of the first capacitor C1 of the first equivalent circuit 810, for example, may be an equivalent circuit value corresponding to the value of the capacitor arranged in the antenna and the capacitance of the capacitor module included in the antenna assistant device. The value of the second capacitor C2, for example, may be an equivalent circuit value corresponding to the capacitance value formed by the floating metal and the inductor module. The value of the second inductor L2 may be an equivalent circuit value corresponding to the inductance value formed by the inductor module or the inductance value formed by a variable inductor additionally connected to the inductor module.

Figure 8B:
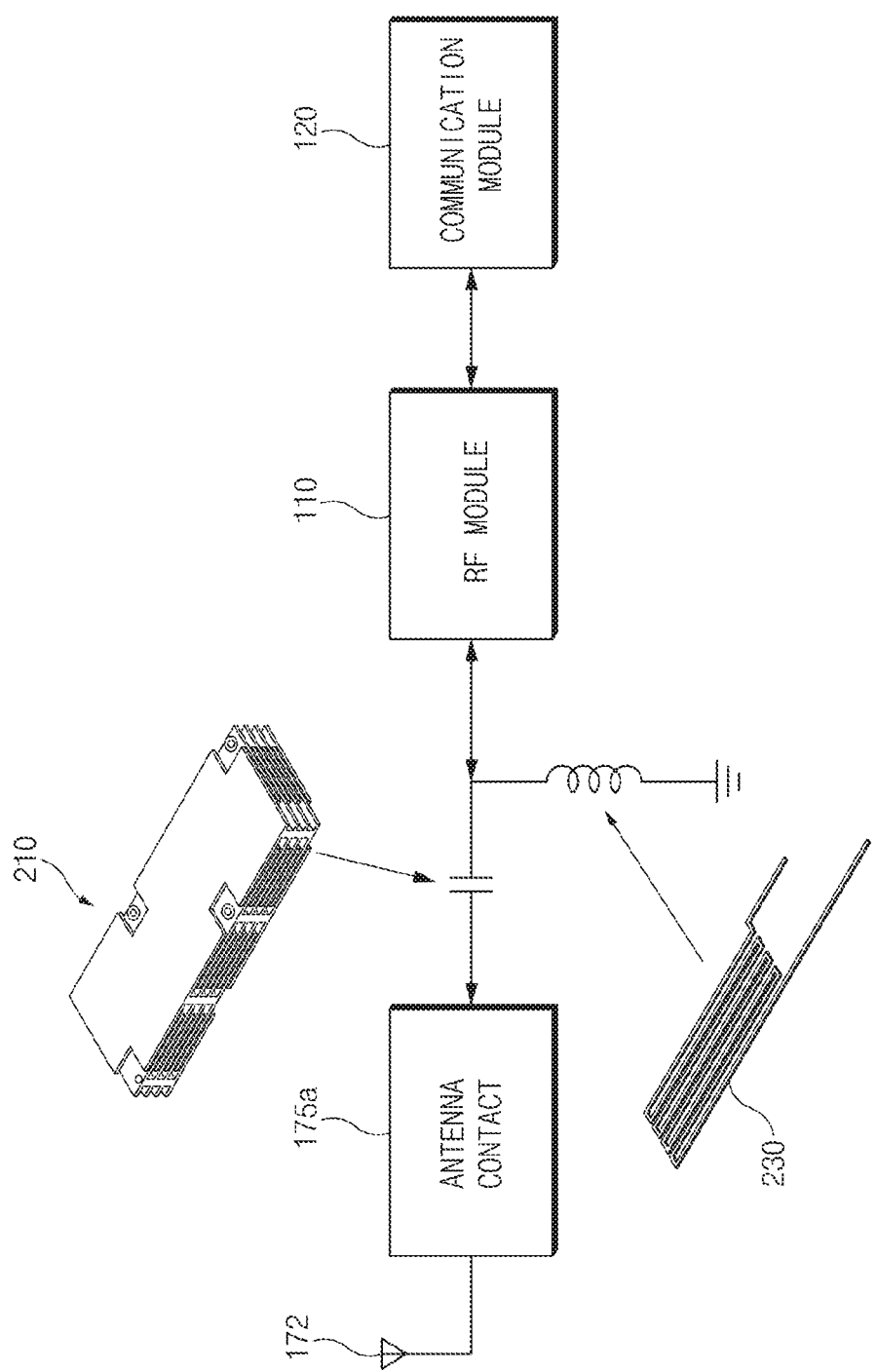

FIG. 8B is a diagram illustrating another example of a communication circuit of an antenna, to which an antenna assistant device is applied, according to an example embodiment.

Referring to FIG. 8B, the communication circuit, to which the antenna assistant device is applied, may include an antenna 172, an antenna contact 175a, a capacitor module 210, an inductor module 230, an RF module 110, and a communication module 120. The capacitor module 210 may be connected in series to the antenna contact 175a, and the inductor module 230 may be connected in parallel to the capacitor module 210. The RF module 110 may be electrically connected to a connection node of the capacitor module 210 and the inductor module 230. In the above-described configuration, a floating metal may be arranged between the capacitor module 210 and the inductor module 230. The capacitor module 210 and the inductor module 230 may be arranged in parallel to perform a filtering function for the antenna 172. The communication circuit of the antenna may prevent and/or reduce an electric shock of the electronic device, to which an external metal (e.g., the antenna) is applied. For example, a leakage current is delivered to a ground by an inductor electrically connected to a DC power source, but the leakage current may be interrupted by the capacitor module 210. For example, the antenna assistant device 200 having ten layers may include lower first to eighth layers corresponding to the capacitor module, the uppermost tenth layer corresponding to the inductor module 230, and an intermediate ninth layer corresponding to the floating metal layer 220.

Figure 9A:
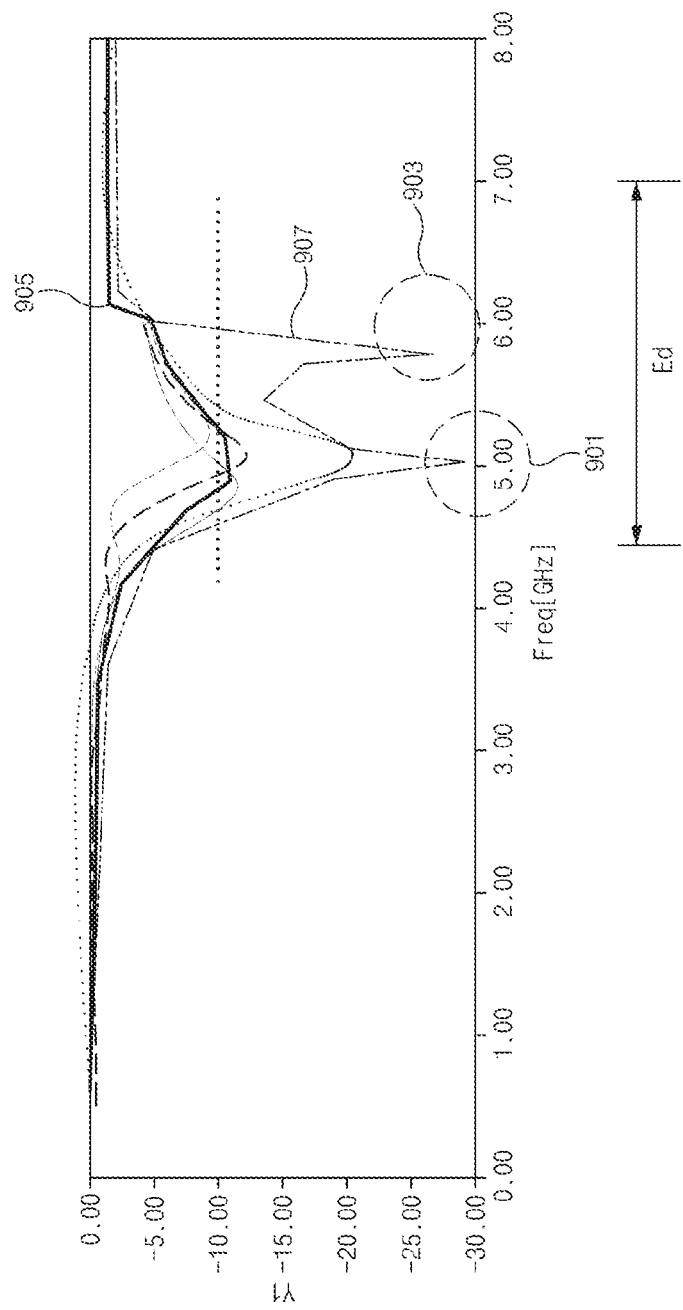
FIGS. 9A, 9B and 9C are graphs illustrating resonance characteristics of an example electronic device according to an example embodiment.

FIG. 9A is a graph illustrating resonance characteristics of an example electronic device according to an example embodiment.

Referring to FIG. 9A, when the antenna 176 and the antenna assistant device 200 transmit signals, it may be identified through area 901 that the antenna assistant device 200 is operated as an impedance matching circuit so that the performance of the resonance frequency band (e.g., 5 GHz) of the antenna 176 is improved. Further, it may be identified through area 903 that the antenna assistant device 200 is operated so that a new resonance frequency (e.g., about 5.8 GHz) is formed.

The frequency characteristics of the case in which the antenna assistant device 200 according to various example embodiments is not applied and only the antenna 176 is applied may be shown as in graph 905. Further, when the antenna 176 and the antenna assistant device 200 are associated with each other, the graph characteristics, for example, of graph 907 may be illustrated. As illustrated, when the antenna assistant device 200 according to various example embodiments is connected to the antenna 176, the frequency bandwidth that is to be operated may be expanded. The first resonance frequency or the second resonance frequency, for example, may be shifted by adjusting the size or capacity (e.g., a capacitance or an inductance) of at least one of the capacitor module 210, the floating metal layer 220, and the inductor module 230 included in the antenna assistant device 200. Further, the resonance frequency band may be modified by arranging an additional variable inductor or the like.

Figure 9B:
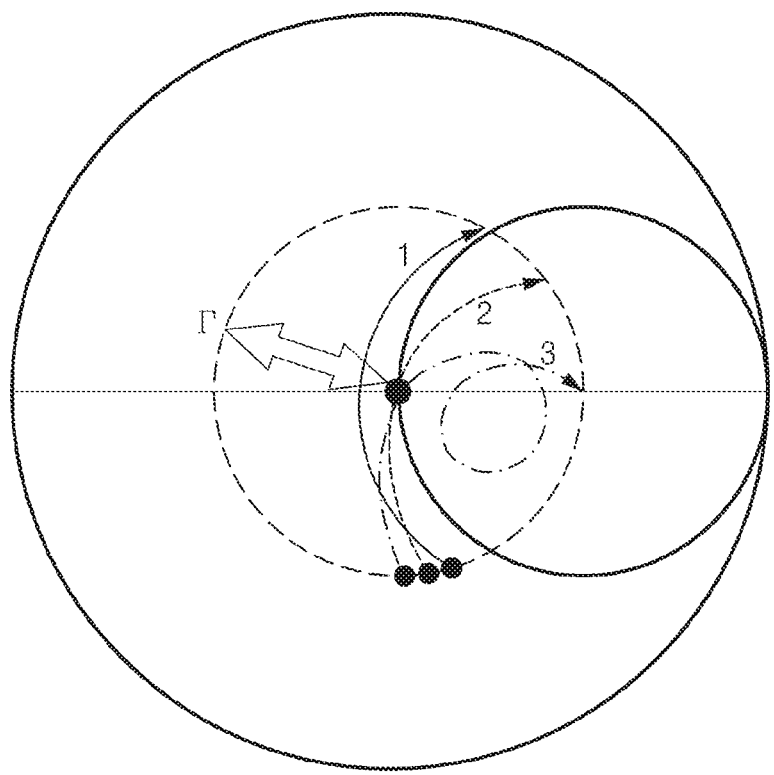
Figure 9C:
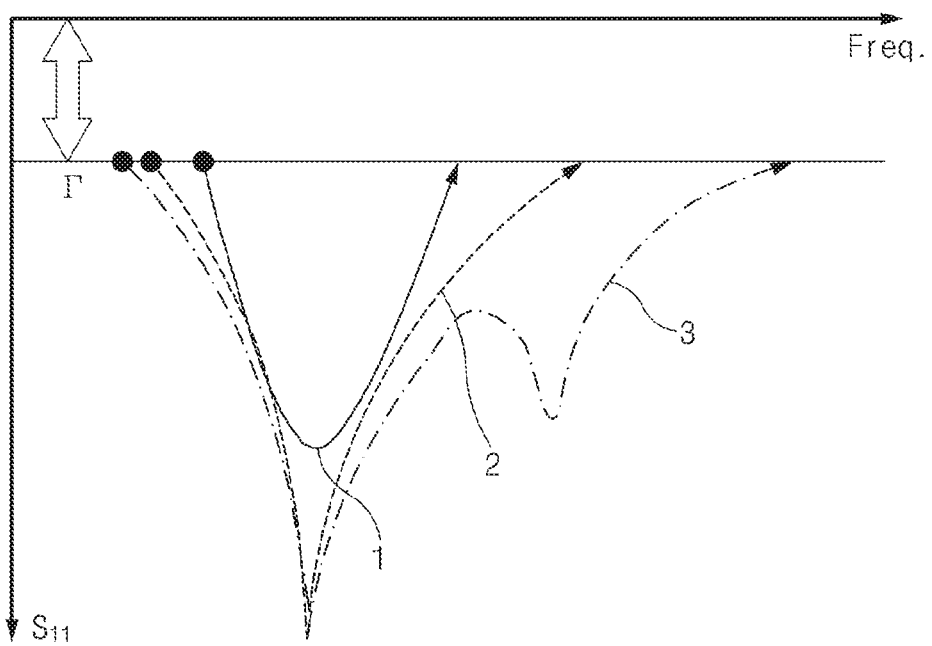

FIG. 9B is a graph depicting a Smith chart related to a transmission line of an example electronic device according to an example embodiment. FIG. 9C is a graph illustrating impedance characteristics of an example electronic device according to an example embodiment.

Referring to FIGS. 9B and 9C, according to various example embodiments, in the electronic device according to an example embodiment, the antenna assistant device 200 may be operated as a matching element as described above in relation to matching of the impedance Zr of the antenna and the characteristic impedance Z0 of the line. The antenna assistant device 200 may perform impedance matching of the antenna to reduce reflective waves, thereby providing a bandwidth increasing effect. In the drawing, Γ may be determined as in Equation 1.

$$\Gamma = (Zr - Z0)/(Zr + Z0) \qquad \text{[Equation 1]}$$

In the illustrated graphs, graph 1 depicts port characteristics when only an antenna is in the electronic device. Further, graph 2 depicts port characteristics when an antenna, a capacitor module 210, and an inductor module 230 are arranged. As illustrated, it can be seen that the characteristic impedance of a line is improved so that a bandwidth increasing effect is generated. When a floating metal layer 220 is not present between the capacitor module 210 and the inductor module, a mutual capacitance is generated between the inductor module 230 (or an embedded inductor) and the capacitor module 210 (or an embedded capacitor) so that inductance is reduced, and as a result, an additional resonance may not be generated between the capacitor module 210 and the inductor module 230.

Graph 3 is a view illustrating port characteristics in a state in which the antenna, the capacitor module 210, the inductor module 230, and the floating metal layer 220 are arranged. As illustrated, the characteristic impedance of the transmission line is improved and the bandwidth is additionally increased by an additional resonance (multi-resonance).

FIG. 10A is a graph illustrating antenna characteristics according to an example embodiment. FIG. 10B is a graph depicting antenna efficiency.

As illustrated in FIGS. 10A and 10B, both a first resonance at a band of 5 GHz and a second resonance at a band of 5.8 GHz secure suitable antenna efficiencies. For example, the antenna radiation power at the band of 5 GHz and the band of 5.8 GHz is an excellent value of 0.8 or more. As described above, the inductor module 230 may support securing of antenna performance while protecting the antenna from static electricity.

Figure 11:
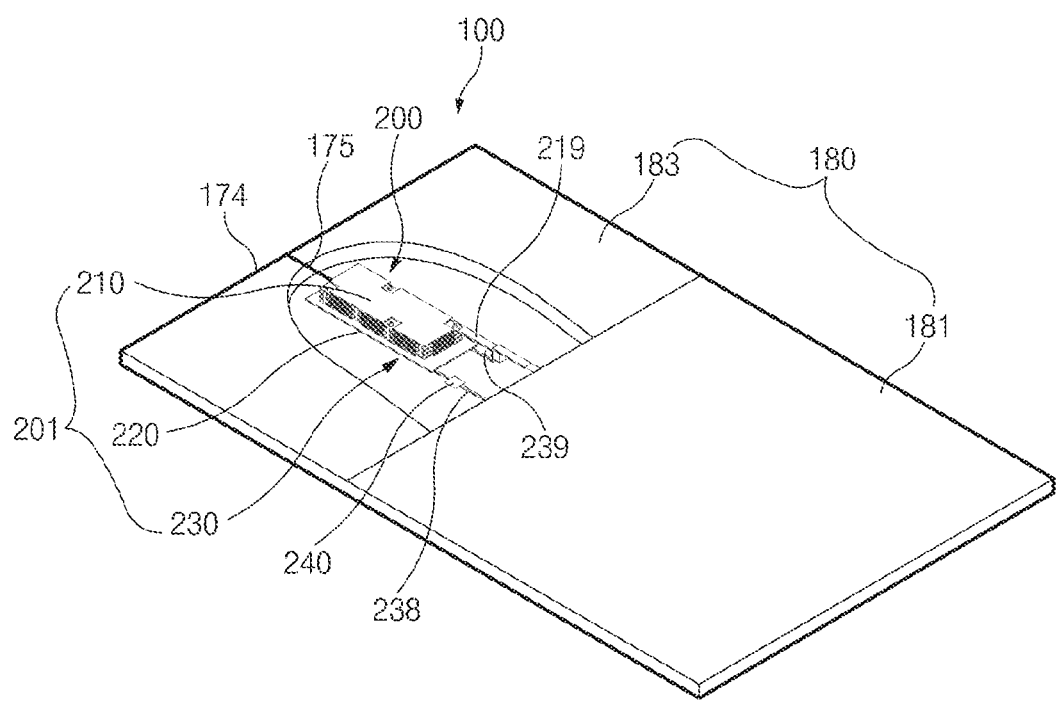
FIG. 11 is a diagram illustrating a part of an example electronic device including an antenna assistant device according to an example embodiment.

FIG. 11 is a diagram illustrating a part of an example electronic device including an antenna assistant device according to an example embodiment.

Referring to FIG. 11, a configuration of the electronic device 100 may include a printed circuit board 180, an antenna assistant device 200, or an antenna 174.

The antenna 174 may be connected to an antenna assistant circuit 201 through an antenna assistant line 175. The antenna 174, for example, may be arranged in an area of the electronic device 100, which is provided in a pattern form. Further, the antenna 174 may correspond to at least a metallic portion of the housing of the electronic device 100. According to various example embodiments, the electronic device 100 may further include physical elements, such as a capacitor and an inductor, which is connected to the antenna 174.

The printed circuit board 180 may include a wiring area 181 and a fill cut area 183. A feeder, in which at least one communication module is arranged and which is connected to the communication module to feed power to the antenna 174, may be arranged in the wiring area 181. Further, a ground area may be arranged in the wiring area 181. The antenna assistant device 200 may be arranged in the fill cut area 183.

The antenna assistant device 200 may include an antenna assistant circuit 201, feeding lines 219 and 239, a ground line 238, an antenna assistant line 175, or a variable inductor 240 (or a chip inductor). The antenna assistant circuit 201, for example, may include a state in which a stacked capacitor module, a floating metal, or an inductor module is stacked. For example, the antenna assistant circuit 201 may include a stacked capacitor module arranged on a floating metal and an inductor module arranged under the floating metal. The inductor module may be connected to a ground area of the printed circuit board 180 through a ground line 238.

The variable inductor 240 may be arranged on the ground line 238. The variable inductor 240 may be connected in series to the inductor module. The inductance of the variable inductor 240 may vary in response to a control signal (e.g., a control signal provided by the processor of the electronic device). Accordingly, a total inductance of the inductances of the inductor module and the variable inductor 240 of the electronic device 100 may be modified. If the total inductance of the values of the inductor module and the variable inductor 240 is modified, the resonance characteristics of the antenna assistant device 200 may be modified. For example, due to the modification of the inductance, sub resonance (or second resonance) characteristics of the antenna assistant device 200 may be modified.

According to various example embodiments, an antenna assistant device according to an example embodiment may include a plurality of stacked substrates (e.g., a capacitor module) for functioning as capacitors, sides of which are electrically connected to an antenna and opposite sides of which are connected to a feeder, a floating metal that are arranged under the plurality of substrates, and at least one substrate for functioning as an inductor, which is arranged under the floating metal, and one side of which is connected to the feeder and an opposite side of which is connected to a ground area.

According to various example embodiments, the plurality of substrates, the floating metal, and the at least one substrate for functioning as an inductor may be formed in a printed circuit board (e.g., a fill cut area).

According to various example embodiments, the capacitor module may include a first capacitor stack which has a surface and in which a plurality of capacitor substrates electrically connected to each other are arranged to be vertically spaced apart from each other by a specific gap, a second capacitor stack which has a surface and in which a plurality of capacitor substrates electrically connected to each other are arranged between the capacitor substrates of the first capacitor stack, and insulation layers that are arranged between the capacitor substrates.

According to various example embodiments, the second capacitor stack may include a via hole that electrically connects the capacitor substrates.

According to various example embodiments, the floating metal may include a metallic substrate, an upper insulation layer that is arranged on the substrate, and a lower insulation layer that is arranged under the substrate.

According to various example embodiments, the inductor module may include signal lines which are arranged in zigzags while being electrically connected to each other.

According to various example embodiments, the antenna assistant device may further include a variable inductor that is electrically connected to the inductor module.

According to various example embodiments, the antenna assistant device may include a first feeding line that electrically connects the capacitor module and the feeder, a second feeding line that electrically connects the inductor module and the feeder, a ground line that electrically connects the inductor module and the ground area, and an antenna connection line that electrically connects one side of the capacitor module and the antenna.

According to various example embodiments, the electronic device may include a housing, a communication circuit (or a communication module) that is arranged within the housing, a multi-layered printed circuit board (PCB) (e.g., the printed circuit board 180) that is arranged within the housing and is electrically connected to the communication circuit, an antenna radiator (e.g., the antenna device 1878) that is arranged within the housing or forms at least a portion of an outer surface of the housing and electrically connected to the communication circuit and the multi-layered printed circuit board, and the multi-layered printed circuit board may include a first conductive pattern (e.g., the capacitor module 210) that is arranged in at least some layers of the multi-layered printed circuit board to form a capacitance, a second conductive pattern (e.g., the inductor module 230) that is arranged in at least some second layers of the multi-layered printed circuit board to form a inductor, and a conductive plate (e.g., the floating metal layer 220) that is arranged between the at least some layers and the at least some second layers of the multi-layered printed circuit board to electrically isolate the first conductive pattern and the second conductive pattern.

According to various example embodiments, the electronic device may further include a first insulation layer between the first conductive pattern and the conductive plate and a second insulation layer between the second conductive pattern and the conductive plate.

According to various example embodiments, wherein the conductive plate is electrically floated from another conductor in the electronic device.

According to various example embodiments, wherein the conductive plate electrically or magnetically shields the first conductive pattern and the second conductive pattern.

According to various example embodiments, the electronic device may further include a conductive pad that is electrically connected to the first conductive pattern and a flexible conductive connection member that is electrically connected to the antenna radiator while contacting the conductive pad.

According to various example embodiments, wherein the first conductive pattern may include a plurality of planar conductive members that are arranged in a plurality of layers of the multi-layered printed circuit board.

According to various example embodiments, wherein the second conductive pattern may include a plurality of bent patterns.

According to various example embodiments, wherein the plurality of bent patterns may include meandering patterns.

According to various example embodiments, wherein the multi-layered printed circuit board may include a rigid printed circuit board and a flexible printed circuit board that is attached to the rigid printed circuit board.

According to various example embodiments, wherein any one of the first conductive pattern and the second conductive pattern is arranged in the rigid printed circuit board, and the other of the first conductive pattern and the second conductive pattern is arranged in the flexible printed circuit board.

According to various example embodiments, the electronic device may further include a control circuit configured to change a point of the multi-layered printed circuit board connected to the communication circuit.

According to various example embodiments, an antenna assistant device is provided. The antenna assistant device may include a capacitor module in which capacitor substrates are stacked, at least sides of the stacked capacitor substrates are electrically connected to an antenna, and at least opposite sides of the stacked capacitor substrates are connected to a feeder, an inductor module which is arranged at a lower or upper portion of the capacitor module, and one side of which is connected to the feeder and an opposite side of which is connected to a ground area and a floating metal layer that is arranged between the capacitor module and the inductor module.

According to various example embodiments, the electronic device may further include a connector (e.g., an antenna contact or a contact part) that is arranged between the antenna radiator and the multi-layered printed circuit board.

According to various example embodiments, the electronic device may further include at least one ground (e.g. the ground) that is arranged within the housing, and the first conductive pattern and/or the second conductive pattern may be electrically connected to the at least one ground.

According to various example embodiments, an electronic device according to an embodiment may include an antenna assistant device including a capacitor module in which capacitor substrates are stacked, a floating metal that is arranged under the capacitor module, and an inductor module that is arranged under the floating metal, an antenna that is connected to one side of the antenna assistant device, and a printed circuit board that is electrically connected to an opposite side of the antenna assistant device.

According to various example embodiments, the electronic device may further include an antenna connector that electrically connects the antenna and the antenna assistant device.

According to various example embodiments, the antenna connector may have a clip shape.

According to various example embodiments, the electronic device may further include a first bonding layer that bonds the antenna connector to the antenna assistant device.

According to various example embodiments, the electronic device may further include an antenna connection line that electrically connects one side of the capacitor module to the antenna.

According to various example embodiments, the printed circuit board may include a wiring area in which wires are arranged in multiple layers, and a fill cut area in which no line is formed and the antenna assistant device is arranged.

According to various example embodiments, the wiring area may include a feeder that feeds electric power to the antenna, and a ground area that is connected to the inductor module.

According to various example embodiments, the antenna may include at least a portion of the housing that surrounds an outer periphery of the electronic device.

According to various example embodiments, the electronic device may further include a second bonding layer that is arranged under the inductor module to fix the antenna assistant device to the printed circuit board.

Figure 12A:
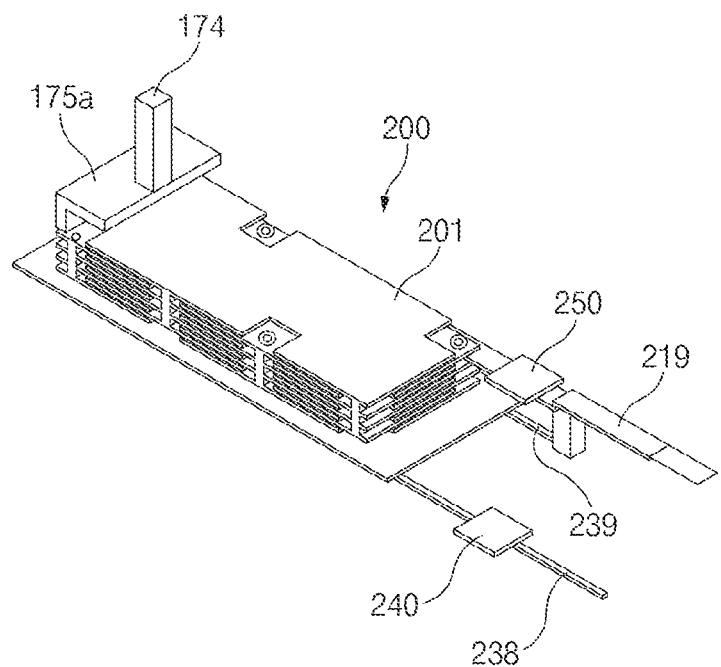
FIG. 12A is a diagram illustrating another example of a configuration of an electronic device including an antenna assistant device according to an example embodiment.
Figure 12B:
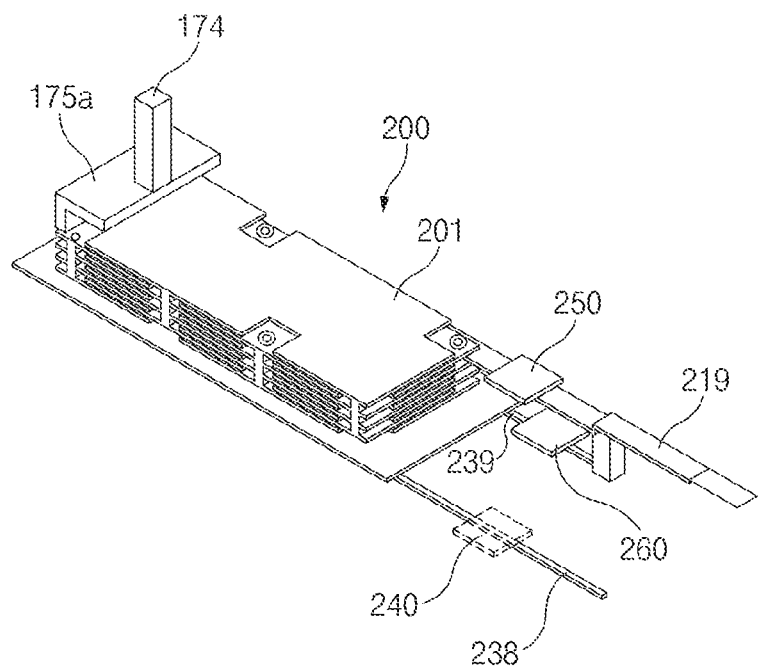
FIG. 12B is a diagram illustrating another example of a configuration of an electronic device including an antenna assistant device according to an example embodiment.

FIG. 12A is a diagram illustrating another example of a configuration of an example electronic device including an antenna assistant device according to an example embodiment. FIG. 12B is a diagram illustrating another example of a configuration of an example electronic device including an antenna assistant device according to an example embodiment.

Referring to FIG. 12A, a configuration of the electronic device may include an antenna assistant device 200 that may be mounted on a printed circuit board 180 or may be arranged independently from the printed circuit board 180, an antenna contact 175a, and an antenna 174.

The antenna 174 may be electrically connected to the antenna assistant device 200 through the antenna contact 175a.

The antenna assistant device 200 may include an antenna assistant circuit 201, feeding lines 219 and 239, a ground line 238, a variable inductor 240 (or a chip inductor), or a variable capacitor 250. The antenna assistant circuit 201, for example, may have a state in which a stacked capacitor module, a floating metal, or an inductor module is stacked. For example, the antenna assistant circuit 201 may include a stacked capacitor module arranged on a floating metal and an inductor module arranged under the floating metal. The inductor module may be connected to a ground area of the printed circuit board through a ground line 238.

As illustrated in FIG. 11, the variable inductor 240 may be arranged on the ground line 238. The variable inductor 240 may be connected in series to the inductor module. The inductance of the variable inductor 240 may vary in response to a control signal (e.g., a control signal provided by the processor of the electronic device). According to various example embodiments, the variable inductor 240 may be replaced by a passive inductor that has an inductance of a specific magnitude.

The variable capacitor 250 may be arranged on a feeding line 219. The variable capacitor 250 may be connected in series to the capacitor module. The capacitance of the variable capacitor 250 may vary in response to a control signal (e.g., a control signal provided by the processor of the electronic device). According to various example embodiments, the variable capacitor 250 may be replaced by a passive capacitor that has a capacitance of a specific magnitude. Accordingly, a total capacitance of the capacitances of the capacitor module and the variable capacitor 250 of the antenna assistant device 200 may be modified. If the total capacitance of the capacitances of the capacitor module and the variable capacitor 250 is modified, the resonance characteristics of the antenna assistant device 200 may be modified. For example, due to the modification of the capacitance, sub resonance (or second resonance) characteristics of the antenna assistant device 200 may be modified.

Referring to FIG. 12B, a configuration of the electronic device may include an antenna assistant device 200 that may be mounted on a printed circuit board 180 or may be arranged independently from the printed circuit board 180, an antenna contact 175a, and an antenna 174. The antenna assistant device 200 may include an antenna assistant circuit 201, feeding lines 219 and 239, a ground line 238, a variable inductor 240 (or a chip inductor), a variable capacitor 250, or a variable assistant inductor 260 (or a chip inductor). Further, the antenna assistant device 200 may exclude the variable inductor 240, and may include the variable assistant inductor 260 and the variable capacitor 250.

The variable assistant inductor 260 may be connected to a feeding line 219. The variable assistant inductor 260 may be connected in parallel to the capacitor module. The inductance of the variable assistant inductor 260 may vary in response to a control signal (e.g., a control signal provided by the processor of the electronic device). The variable assistant inductor 260 may contribute to a change in the inductances of the inductor module and the variable inductor 240.

Figure 13A:
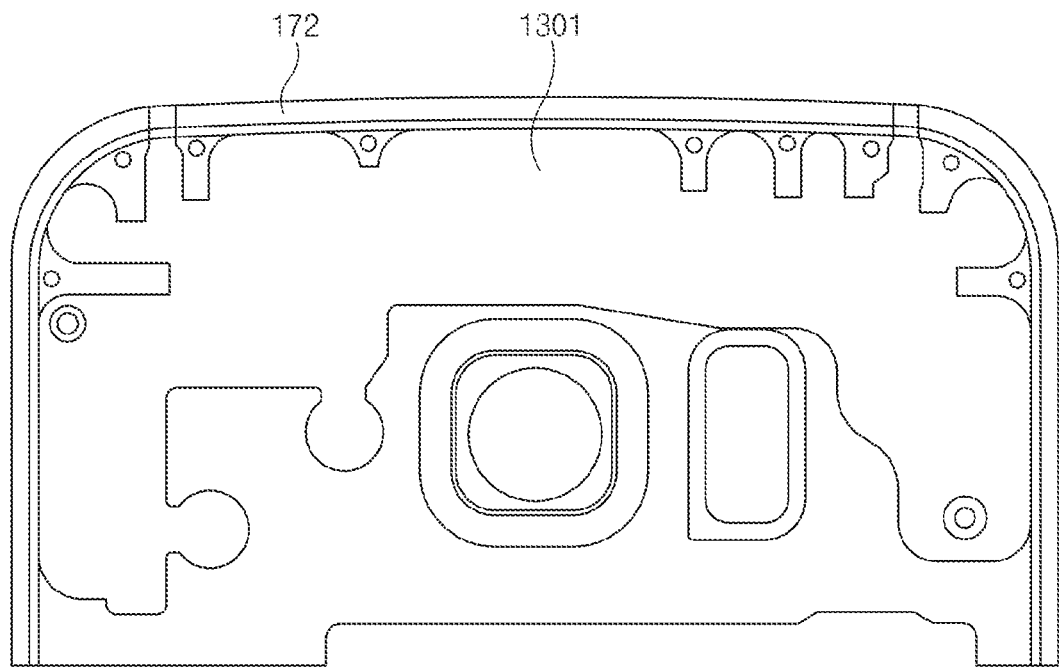
FIGS. 13A and 13B are block diagrams illustrating an example electronic device according to various example embodiments.
Figure 13B:
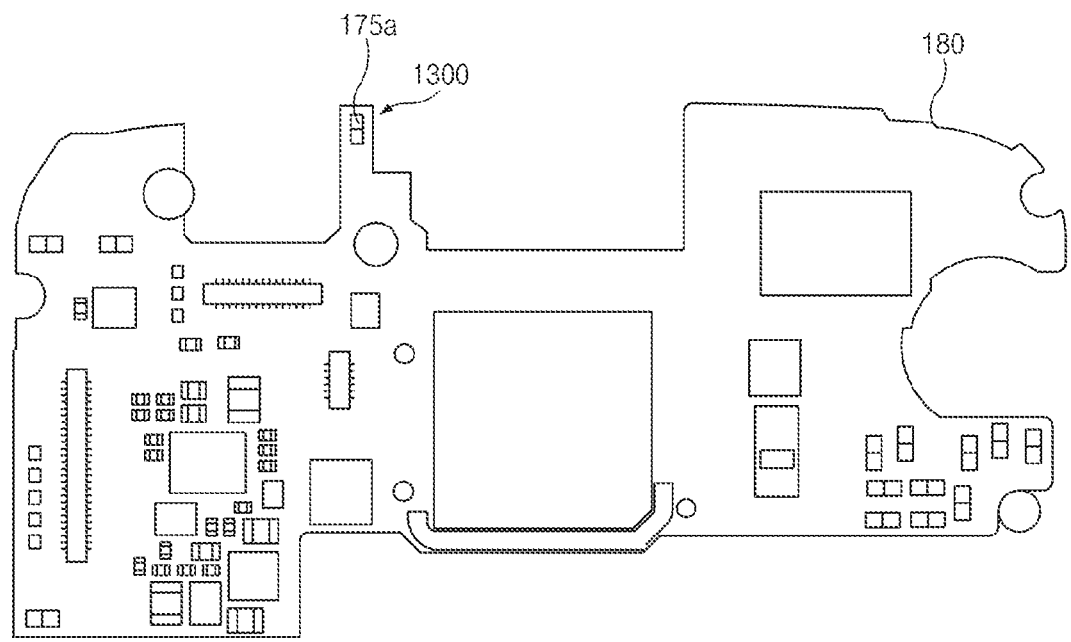

FIG. 13A is a diagram illustrating a portion of an external appearance of an example electronic device according to an example embodiment. FIG. 13B is a diagram illustrating an example of a form of a printed circuit board according to an example embodiment.

Referring to FIGS. 13A and 13B, at least a portion of at least a peripheral area of the electronic device 100, for example, may be formed of a conductive material (e.g., a metal) such that a peripheral area of the electronic device 100 is used as an antenna 172. The electronic device 100 may include an area 1301 in which the printed circuit board 180 is seated. The area 1301 is a portion of a structure, and may be formed of a nonmetallic material or have an opened structure. According to an example embodiment, at least an area 1300 of the printed circuit board 180 may be arranged close to an area in which the antenna 172 is arranged. For example, the antenna contact 175a may be arranged in an area 1300 of the printed circuit board 180. According to an embodiment, at least a portion of the antenna contact 175a may include a clip form.

Figure 14:
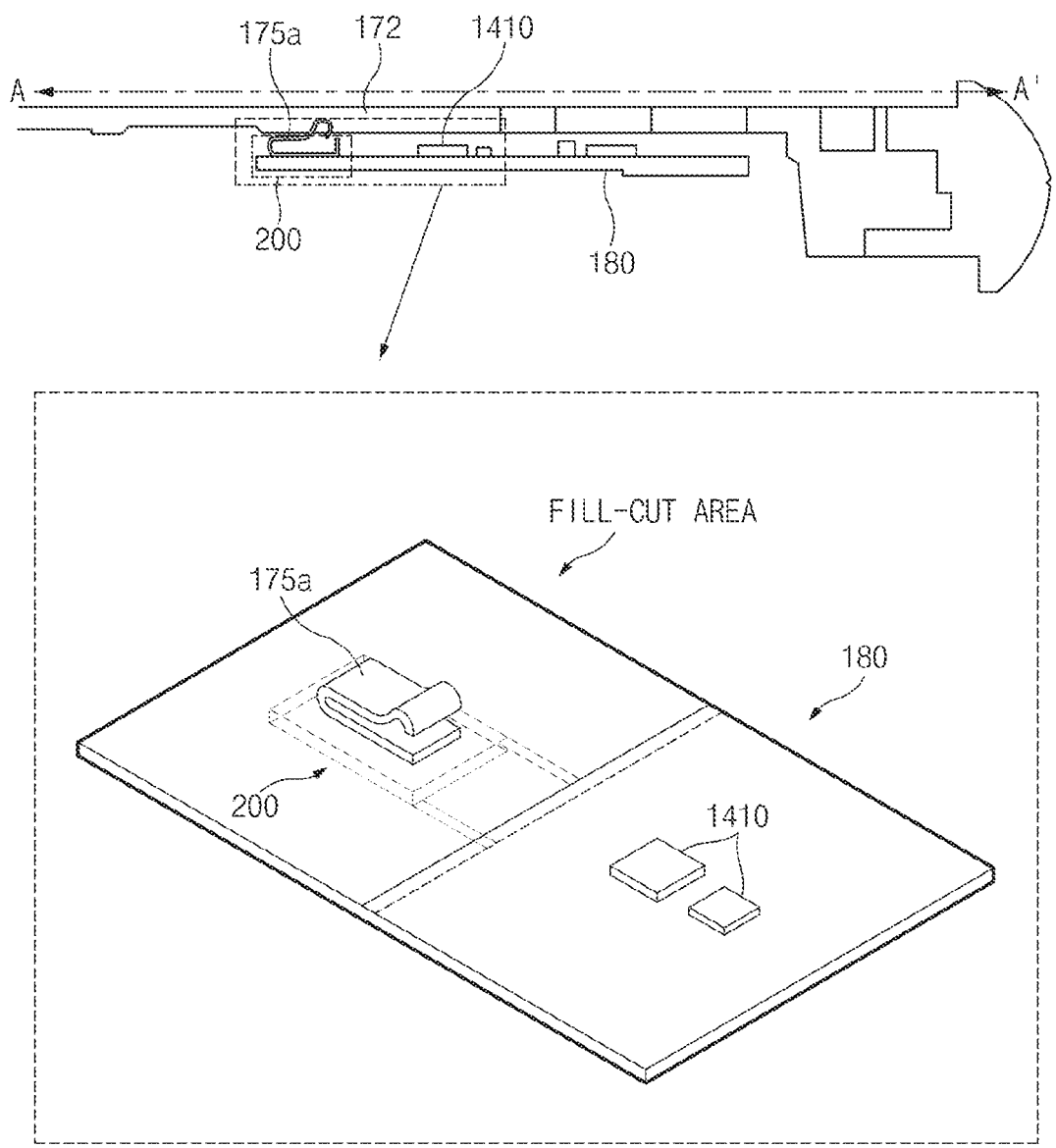
FIG. 14 is a diagram illustrating a section of an example electronic device according to an example embodiment.

FIG. 14 is a diagram illustrating a section of an example electronic device according to an example embodiment.

Referring to FIG. 14, as illustrated, the electronic device may include an antenna 172 that is arranged in a peripheral area thereof, an antenna contact 175a that is arranged under the antenna 172, a printed circuit board 180 which the antenna contact 175a electrically contacts, and an antenna assistant device 200 that is arranged in an area of the printed circuit board 180. Further, the electronic device 100 may include a surface mounted device (SMD) component 1410 that is arranged in an area of the printed circuit board 180. The SMD component 1410, for example, may be a component (e.g., an antenna feeder, an antenna receiver, or a processor) that uses the antenna assistant device 200.

As illustrated, the antenna assistant device 200 may be mounted on the printed circuit board 180 or at least a portion of the antenna assistant device 200 may be formed inside the printed circuit board 180. The antenna assistant device 200 may be electrically connected to the antenna contact 175a by the above-described signal line. For example, the signal line may include an area of the antenna assistant device 200, in which a metal layer of the antenna assistant device 200 is exposed to the outside. Accordingly, the antenna assistant device 200 may be physically or electrically connected to a lower portion of the antenna contact 175a.

The antenna contact 175a, for example, may be formed of a metallic material, and may electrically connect the antenna 172 and the antenna assistant device 200. In the above-described structure, the antenna assistant device 200 may be provided such that the stacked capacitor module, the floating metal, and the inductor module are stacked, to improve the frequency characteristics of the antenna 172 (e.g., expand a resonance frequency band), prevent an electrical shock, and support provision of a sub resonance band.

Figure 15A:
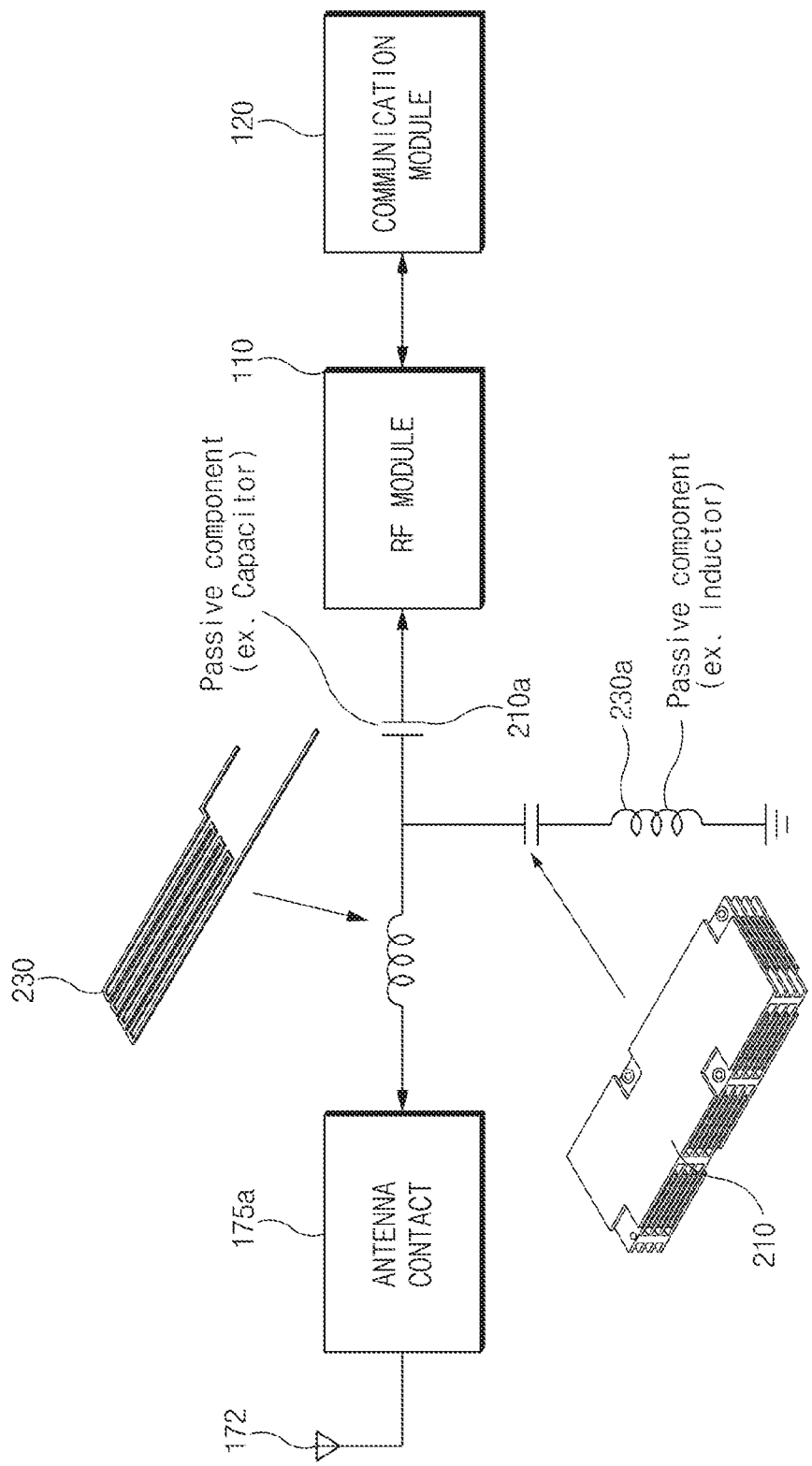
FIG. 15A is a diagram illustrating an example of a transmission line of an electronic device according to an example embodiment.

FIG. 15A is a diagram illustrating an example of a transmission line of an electronic device according to an example embodiment. FIG. 15B is a diagram illustrating another example of a transmission line of an electronic device according to an example embodiment.

Referring to FIG. 15A, the antenna transmission line of the electronic device, for example, may include an antenna 172, an antenna contact 175a, an inductor module 230, a capacitor module 210, an assistant inductor 230a, an assistant capacitor 210a, an RF module 110, and a communication module 120.

The inductor module 230 may be directly connected to the antenna contact 175a. The capacitor module 210 may be connected in parallel to the inductor module 230. The assistant inductor 230a may be connected in series to the capacitor module 210. The assistant capacitor 210a may be connected in series to the inductor module 230, and may be connected in parallel to the capacitor module 210. The assistant inductor 230a, for example, may include at least one of a variable inductor or a passive inductor having an inductance of a specific magnitude. The assistant capacitor 210a, for example, may include at least one of a variable capacitor or a passive capacitor having a capacitance of a specific magnitude. The above-described structure, for example, supports adjustment of at least one of an inductance of the assistant inductor 230a or a capacitance of the assistant capacitor 210a based on the characteristics of a frequency band, which is to be designed, like the antenna assistant device of FIG. 12. Even after the set of the electronic device is completely assembled, the antenna transmission line of the structure supports acquisition of necessary frequency characteristics by adjusting at least one of inductance or capacitance.

Referring to FIG. 15B, the antenna transmission line of the electronic device, for example, may include an antenna 172, an antenna contact 175a, an inductor module 230, an additional assistant capacitor 210b, a capacitor module 210, an assistant inductor 230a, an RF module 110, and a communication module 120. Additionally or alternatively, the antenna transmission line of the electronic device may connect the assistant 210a to the additional assistant capacitor 201b in series. The additional assistant capacitor 210b, for example, may be a variable capacitor. The additional assistant capacitor 210b, for example, may be a fixed capacitor. The additional assistant capacitor 210b may be connected in series to the inductor module 230, and may be used to adjust resonance frequency.

Figure 16:
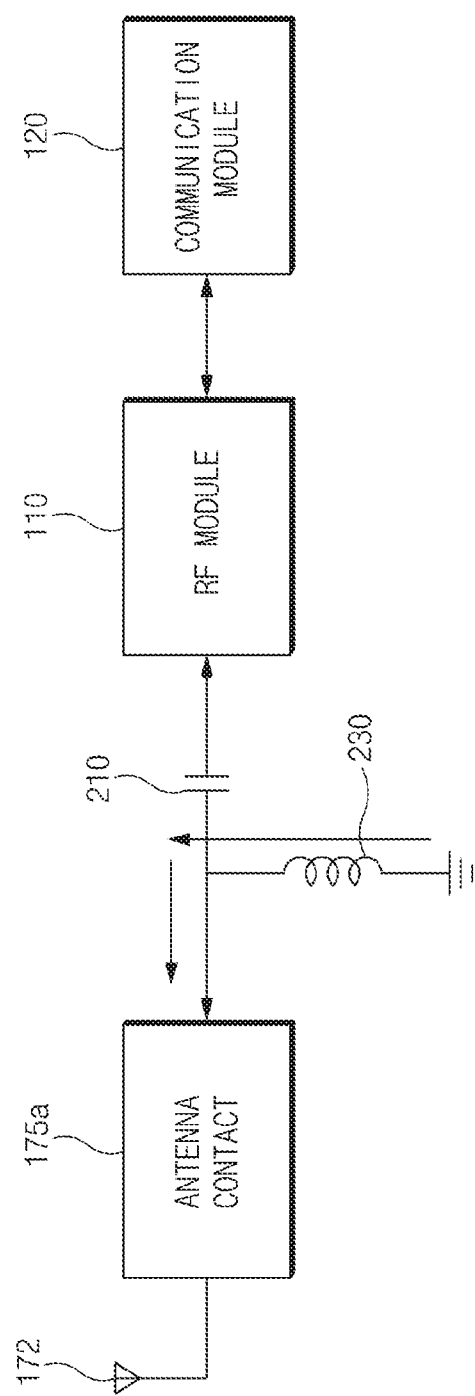
FIG. 16 is a diagram illustrating another example of a transmission line of an electronic device according to an example embodiment.

FIG. 16 is a diagram illustrating another example of a transmission line of an electronic device according to an example embodiment.

Referring to FIG. 16, the antenna transmission line of the electronic device, for example, may include an antenna 172, an antenna contact 175a, a capacitor module 210, an inductor module 230, an RF module 110, and a communication module 120.

The capacitor module 210 may be connected in parallel to the antenna contact 175a. The inductor module 230 may be connected in series to the antenna contact 175a, and the capacitor module 210 may be connected in parallel to the inductor module 230. The antenna transmission line having the above-described structure may have a structure in which the capacitor module 210 is connected to the antenna contact 175a at a front end of the inductor module 230 and may have a structure in which the inductor module 230 is connected to the RF module 110 at a rear end of the capacitor module 210. The above-described structure, for example, a ten-layered antenna assistant device 200 may be provided such that the lower first layer corresponds to the inductor module 230, the third to tenth layers correspond to the capacitor module 210, and the intermediate second layer corresponds to the floating metal layer 220.

Figure 17:
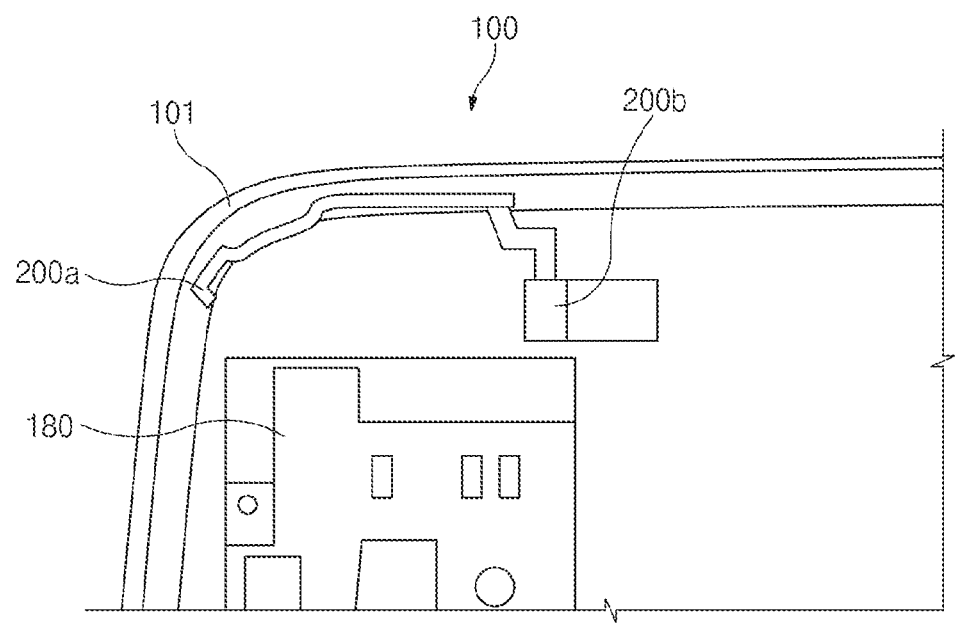
FIG. 17 is a diagram illustrating an example of a location of an antenna assistant device according to an example embodiment.

FIG. 17 is a diagram illustrating an example of a location of an antenna assistant device according to an example embodiment.

Referring to FIG. 17, the electronic device 100 according to an example embodiment, for example, may include an antenna assistant device 200 that is arranged on a printed circuit board 180 in a specific pattern. According to various example embodiments, the electronic device 100 may include a pattern corresponding to the antenna assistant device 200 formed in an area of a structure 101. According to an example embodiment, when the antenna assistant device 200 is arranged or formed on at least one side of the structure 101, the electronic device 100 may further include a circuit line that is electrically connected to the antenna assistant device 200 arranged in the structure 101 and the printed circuit board 180.

According to various example embodiments, a plurality of antenna assistant devices 200 may be provided. For example, as illustrated, the electronic device 100 may include a first antenna assistant device 200a that is provided in the structure 101 in a pattern form and a second antenna assistant device 200b that is mounted on the printed circuit board 180. The first antenna assistant device 200a and the second antenna assistant device 200b may include at least one of a capacitor module, a floating metal, or an inductor module.

Figure 18A:
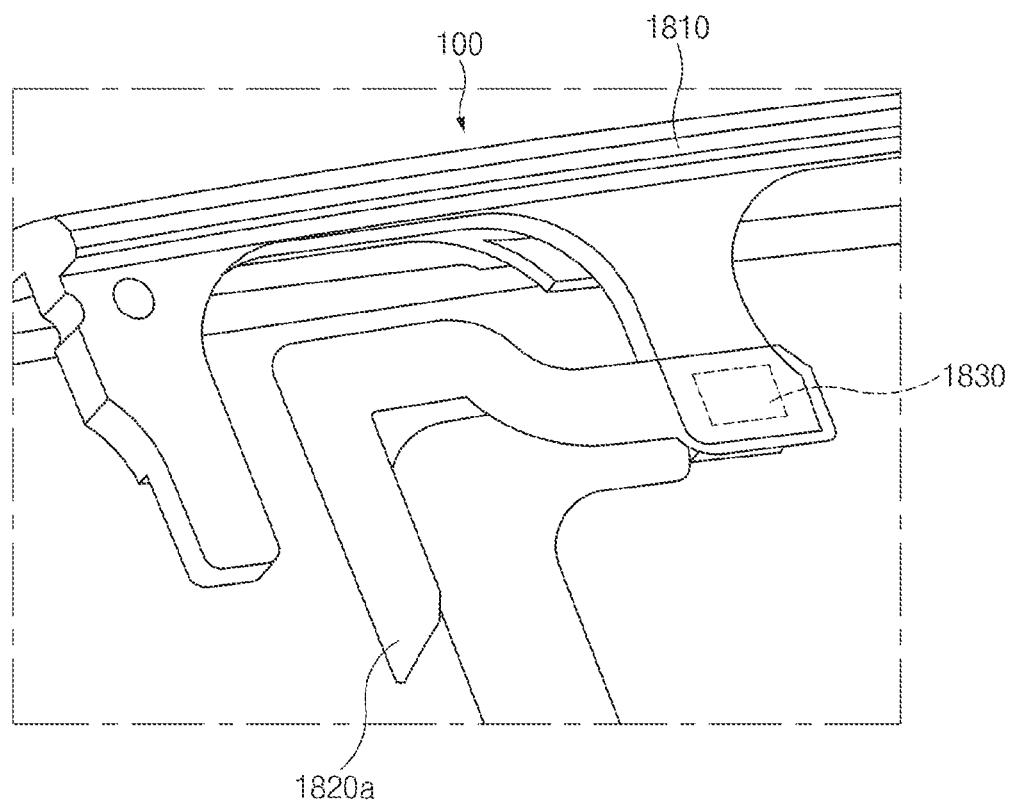
FIG. 18A is a diagram illustrating another example of a location of an antenna assistant device according to an example embodiment.
Figure 18B:
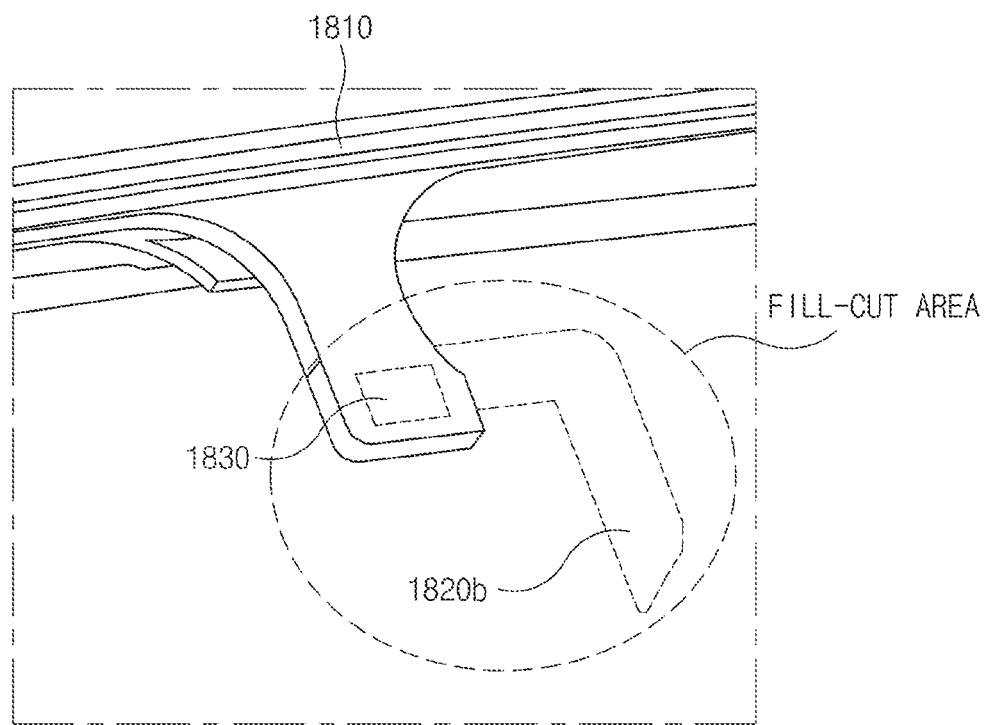
FIG. 18B is a diagram illustrating another example of a location of an antenna assistant device according to an example embodiment.

FIG. 18A is a diagram illustrating another example of a location of an antenna assistant device according to an example embodiment. FIG. 18B is a diagram illustrating another example of a location of an antenna assistant device according to an example embodiment.

Referring to FIG. 18A, the electronic device 100 according to an example embodiment, for example, may include an external metal part 1810 (e.g., a metal part that is operated as an antenna), an antenna assistant device 1820a that is formed on an FPCB, and a contact part 1830. The antenna assistant device 1820a, for example, may be electrically connected to the external metal part 1810 through the contact part 1830. The antenna assistant device 1820a may be formed or arranged in a fill cut area of a rigid printed circuit board. The antenna assistant device 1820a formed on the FPCB, for example, may include at least a portion of the FPCB. The FPCB may electrically connect the printed circuit board (e.g., the rigid printed circuit board) and the external metal part. A capacitor module, a floating metal, and an inductor module may be stacked on the FPCB to comprise the antenna assistant device 1820a.

Referring to FIG. 18B, the electronic device 100 according to an example embodiment, for example, may include an external metal part 1810 (e.g., a metal part that is operated as an antenna), an antenna assistant device 1820a that is formed in a fill cut area of the printed circuit board, and a contact part 1830. The antenna assistant device 1820b may be provided by forming some metal layers between a plurality of insulation layers in the printed circuit board, and may be electrically connected to the external metal part 1810 through the contact part 1830 while some of the metal layers are exposed to the upper side. According to various example embodiments, the electronic device 100 may include an antenna assistant device 1820a that is formed on an FPCB and an antenna assistant device 1820b that is formed on a fill cut area of the printed circuit board. In this case, the electronic device 100 may improve frequency characteristics of the electronic device by using a plurality of antenna assistant devices.

According to various example embodiments, the above-described antenna assistant device 1820b may be an antenna pattern. The antenna pattern, for example, may be provided by forming a metal layer in a fill cut area of the printed circuit board. The antenna pattern may be electrically connected to the external metal part 1810 through the contact part 1830. Further, the antenna pattern may be electrically connected to the antenna assistant device 1820a of FIG. 18A.

According to various example embodiments, the electronic device 100 may include an electrical connection state of an antenna pattern provided in a fill cut area of the printed circuit board and the antenna assistant device 1820a of FIG. 18A. In the structure, the electronic device 100 may exclude an electrical connection of the external metal part 1810 and the antenna assistant device 1820a. The antenna assistant device 1820a may be electrically connected to an antenna pattern formed in a fill cut area of the printed circuit board to contribute to improvement of frequency characteristics of a specific communication module.

Figure 19A:
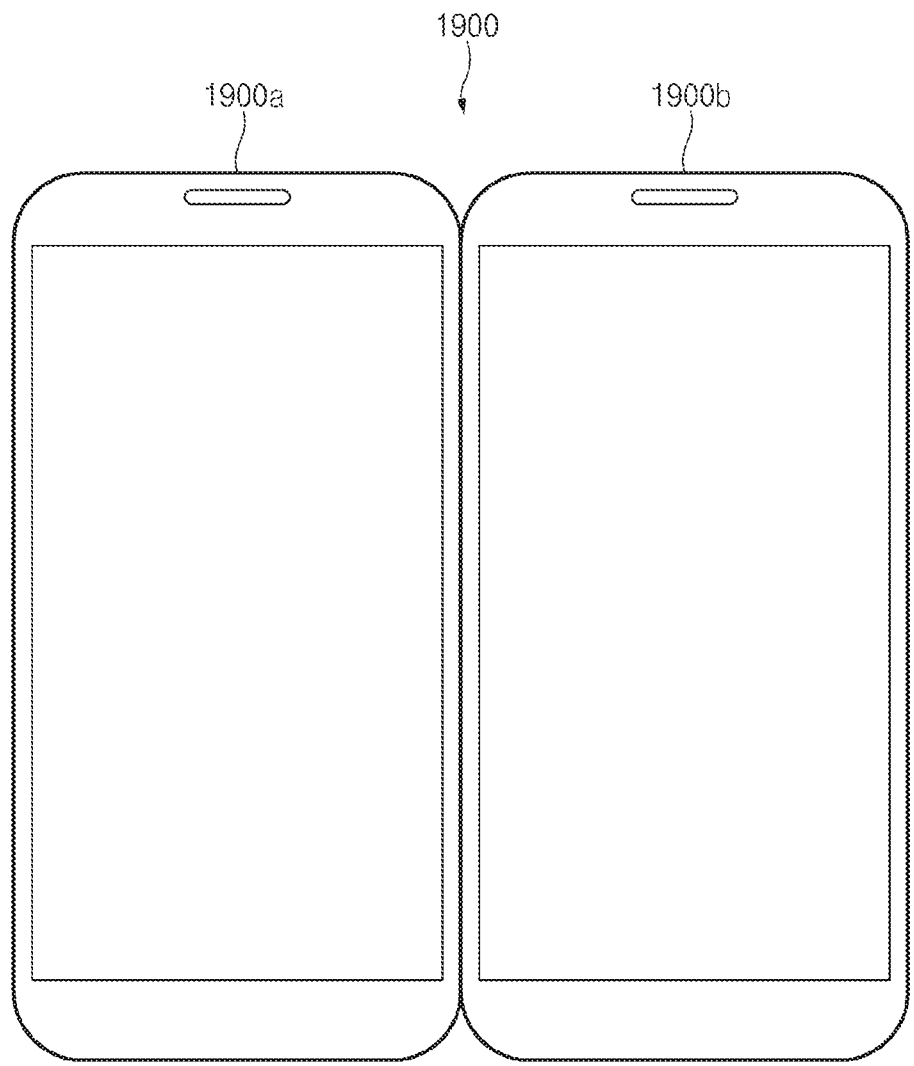
FIG. 19A is a diagram illustrating another example of an electronic device, to which an antenna assistant device may be applied, according to an example embodiment.

FIG. 19A is a diagram illustrating another example of an electronic device, to which an antenna assistant device is applied, according to an example embodiment.

Referring to FIG. 19A, the antenna assistant device according to various example embodiments, for example, may be also formed in an electronic device 1900 that includes a dual display. According to various example embodiments, the electronic device 1900 may be a foldable electronic device. According to various example embodiments, the electronic device 1900 may be provided such that one display may be folded.

When the electronic device 1900 is folded, a frequency tilt may be generated. For example, in a GPS using a single frequency, the performance of the electronic device 1900 may deteriorate. An electronic device, to which the above-described antenna assistant device 200 is applied, may secure a relatively wide bandwidth to support stable antenna characteristics even though it is folded.

Figure 19B:
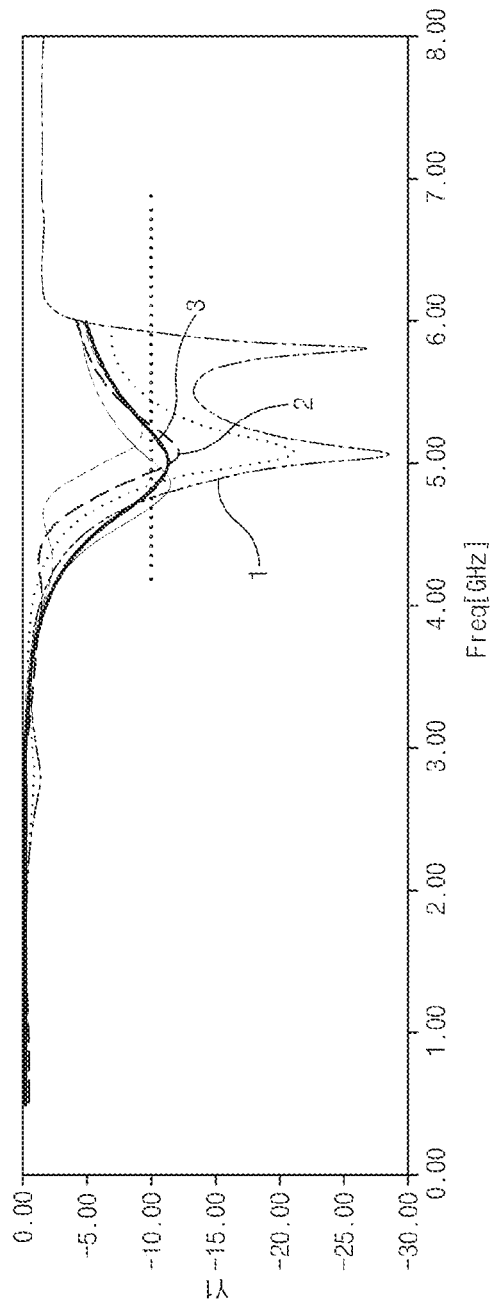
FIG. 19B is a graph illustrating frequency characteristics of an example foldable electronic device according to an example embodiment.

FIG. 19B is a graph illustrating frequency characteristics of an example foldable electronic device according to an example embodiment.

Referring to FIG. 19B, the foldable electronic device is opened to show frequency characteristics of a first graph when it is arranged such that the displays indicate the same direction. Further, stable frequency characteristics of a second graph may be shown even though the foldable electronic device is folded such that the displays face each other. A third graph, for example, is a graph depicting a state in which only an antenna is applied.

According to various example embodiments, an electronic device according to an embodiment, to which an antenna assistant device is applied, may improve antenna characteristics of the electronic device, by preventing an electric shock, improving frequency characteristics of an antenna, and providing a sub resonance frequency band.

According to various example embodiments, an electronic device according to an example embodiment may include an antenna assistant device that is mounted in an area of a printed circuit board to feed electric power to the antenna and ground the antenna and that includes a stacked capacitor module, an inductor module, and a floating metal that is arranged between the capacitor module and the inductor module, and an antenna that is connected to one side of the antenna assistant device.

According to various example embodiments, the antenna assistant device may be formed by at least a portion of a fill cut area from which wiring lines are removed and in which a plurality of layers, at least some of which include a metal component, are arranged.

According to various example embodiments, the printed circuit board may include a feeder that feeds electric power to the antenna through the antenna assistant device, and a ground area that is connected to the inductor module.

According to various example embodiments, the electronic device may further include a second bonding layer that fixes the inductor module to the printed circuit board.

According to various example embodiments, the floating metal may include a metallic substrate, an upper insulation layer that is arranged on the substrate, and a lower insulation layer that is arranged under the substrate.

According to various example embodiments, the electronic device may further include at least one of a variable inductor that is electrically connected to the inductor module or an auxiliary inductor that has a specific inductance, and at least one of a variable capacitor that is electrically connected to the capacitor module or an auxiliary capacitor that has a specific capacitance.

Figure 20:
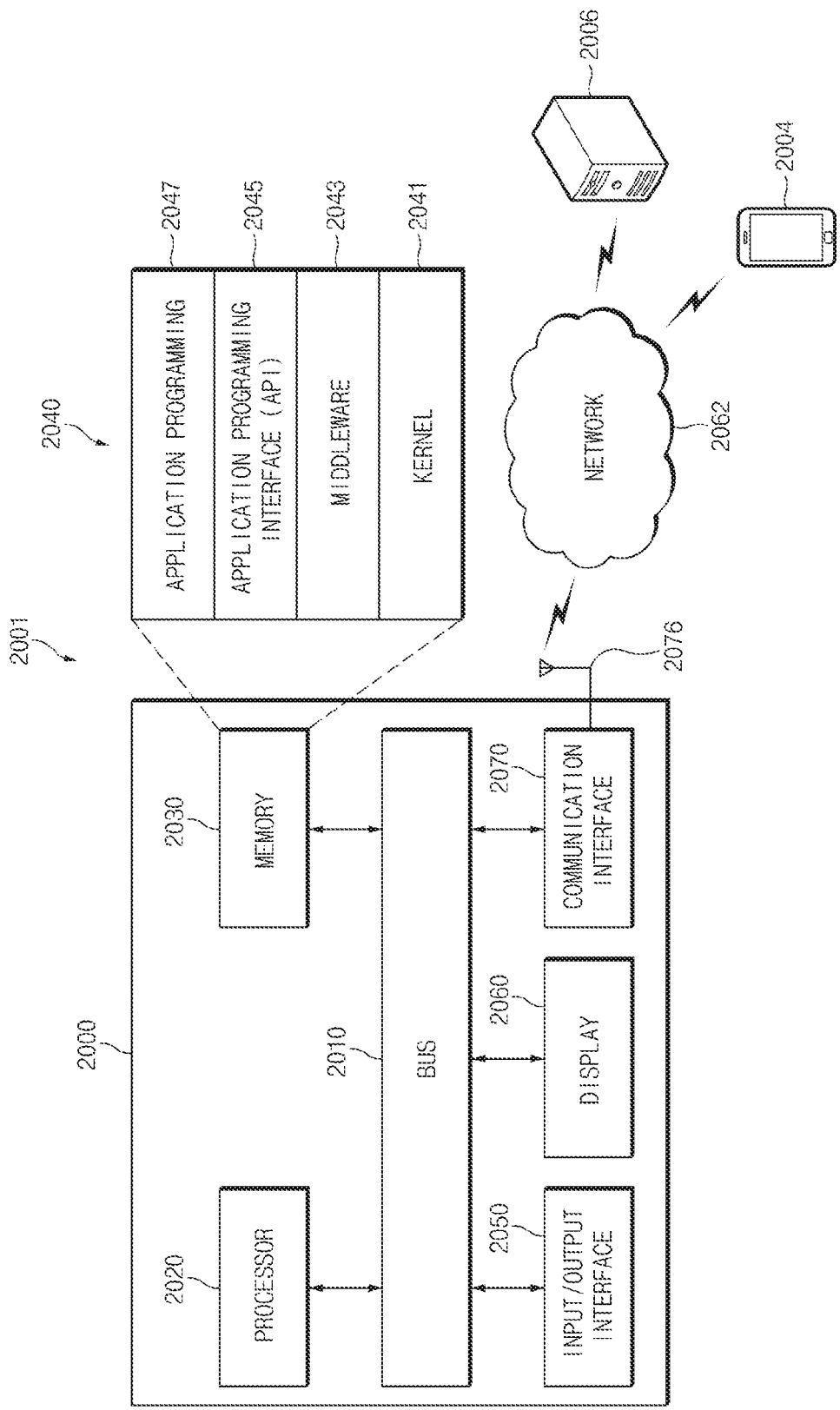
FIG. 20 is a diagram illustrating an example electronic device in a network environment according to an example embodiment.

FIG. 20 is a diagram illustrating an electronic device in a network environment according to an example embodiment.

Referring to FIG. 20, the electronic device network environment 2001 according to an example embodiment may include an electronic device 2000, a second external electronic device 2004, a server 2006, and a network 2062.

The network 2062 may support formation of a communication channel between the electronic device 2000 and the external electronic device 2004 or between the electronic device 2000 and the server 2006. The network 2062 helps transmit a content stored in the electronic device 2000 to the external electronic device 2004 or the server 2006.

The server 2006 may form a communication channel with the electronic device 2000 through the network 2062. The server 2006 may receive contents from the electronic device 2000 and store the received contents. Further, the server 2006 may provide a feedback for the reception of the contents to the electronic device 2000.

The above-mentioned electronic device 2000 may include a bus 2010, a processor (e.g., including processing circuitry) 2020, a memory 2030, an input/output interface (e.g., including input/output circuitry or input/output device) 2050, a display 2060, and a communication interface (e.g., including communication circuitry) 2070. Further, the electronic device 2000 may include an antenna 2076 that is connected to the communication interface 2070. In addition, the electronic device 2000 may further include an antenna assistant device (not shown) that is arranged between the communication interface 2070 and the processor 2020. In some embodiments, the electronic device 2000 may exclude at least one of the elements or may additionally include another element. Further, the electronic device 2000 may include a housing that surrounds or receives at least some of the configurations.

The bus 2010 may be, for example, a circuit which connects the components 2020 to 2070 with each other and transmits a communication signal (e.g., a control message and/or data) between the components.

The processor 2020 may include various processing circuitry, such as, for example, and without limitation, one or more of a dedicated processor, a central processing unit (CPU), an application processor (AP), or a communication processor (CP), or the like. For example, the processor 2020 may perform calculation or data processing about control and/or communication of at least another of the components of the electronic device 2001.

The processor 2020 may control a variable value of a variable inductor, which has been described above. For example, when the antenna performance is a reference value or less, the processor 2020 may change the physical characteristics of the antenna assistant device by adjusting an inductance value of the variable inductor. Through this, the process 2020 may improve frequency characteristics by adjusting sub-resonance characteristics.

The memory 2030 may include a volatile and/or non-volatile memory. The memory 2030 may store, for example, a command or data associated with at least another of the components of the electronic device 2001. According to an embodiment, the memory 2030 may store software and/or a program 2040. The program 2040 may include, for example, a kernel 2041, a middleware 2043, an application programming interface (API) 2045, and/or an least one application program 2047 (or "at least one application"), and the like. At least part of the kernel 2041, the middleware 2043, or the API 2045 may be referred to as an operating system (OS).

The kernel 2041 may control or manage, for example, system resources (e.g., the bus 2010, the processor 2020, or the memory 2030, and the like) used to execute an operation or function implemented in the other programs (e.g., the middleware 2043, the API 2045, or the application program 2047). Also, as the middleware 2043, the API 2045, or the application program 2047 accesses a separate component of the electronic device 2001, the kernel 2041 may provide an interface which may control or manage system resources.

The middleware 2043 may play a role as, for example, a go-between such that the API 2045 or the application program 2047 communicates with the kernel 2041 to communicate data.

Also, the middleware 2043 may process one or more work requests, received from the application program 2047, in order of priority. For example, the middleware 2043 may assign priority which may use system resources (the bus 2010, the processor 2020, or the memory 2030, and the like) of the electronic device 2001 to at least one of the at least one application program 2047. For example, the middleware 2043 may perform scheduling or load balancing for the one or more work requests by processing the one or more work requests in order of the priority assigned to the at least one of the at least one application program 2047.

The API 2045 may be, for example, an interface in which the application program 2047 controls a function provided from the kernel 2041 or the middleware 2043. For example, the API 2045 may include at least one interface or function (e.g., a command) for file control, window control, image processing, or text control, and the like.

The input/output interface 2050 may include various input/output circuitry configured to play a role as, for example, an interface which may transmit a command or data input from a user or another external device to another component (or other components) of the electronic device 2001. Also, input/output interface 2050 may output an instruction or data received from another component (or other components) of the electronic device 2001 to the user or the other external device.

The display 2060 may include, for example, a liquid crystal display (LCD), a light emitting diode (LED) display, an organic LED (OLED) display, a microelectromechanical systems (MEMS) display, or an electronic paper display, or the like, but is not limited thereto. The display 2060 may display, for example, a variety of content (e.g., text, images, videos, icons, or symbols, and the like) to the user. The display 2060 may include a touch screen, and may receive, for example, touch, gesture, proximity, or a hovering input using an electronic pen or part of a body of the user.

The communication interface 2070 may include various communication circuitry and establish communication between, for example, the electronic device 2001 and an external device (e.g., a first external electronic device 2002, a second external electronic device 2004, or a server 2006). For example, the communication interface 2070 may connect to a network 2062 through wireless communication or wired communication and may communicate with the external device (e.g., the second external electronic device 2004 or the server 2006).

The wireless communication may use, for example, at least one of long term evolution (LTE), LTE-advanced (LTE-A), code division multiple access (CDMA), wideband CDMA (WCDMA), universal mobile telecommunications system (UMTS), wireless broadband (WiBro), or global system for mobile communications (GSM), and the like as a cellular communication protocol. Also, the wireless communication may include, for example, local-area communication 2064. The local-area communication 2064 may include, for example, at least one of wireless-fidelity (Wi-Fi) communication, Bluetooth (BT) communication, near field communication (NFC), or global navigation satellite system (GNSS) communication, and the like.

An MST module may generate a pulse based on transmission data using an electromagnetic signal and may generate a magnetic field signal based on the pulse. The electronic device 2001 may output the magnetic field signal to a point of sales (POS) system. The POS system may restore the data by detecting the magnetic field signal using an MST reader and converting the detected magnetic field signal into an electric signal.

The GNSS may include, for example, at least one of a global positioning system (GPS), a Glonass, a Beidou navigation satellite system (hereinafter referred to as "Beidou"), or a Galileo (i.e., the European global satellite-based navigation system) according to an available area or a bandwidth, and the like. Hereinafter, the "GPS" used herein may be interchangeably with the "GNSS". The wired communication may include at least one of, for example, universal serial bus (USB) communication, high definition multimedia interface (HDMI) communication, recommended standard 232 (RS-232) communication, or plain old telephone service (POTS) communication, and the like. The network 2062 may include a telecommunications network, for example, at least one of a computer network (e.g., a local area network (LAN) or a wide area network (WAN)), the Internet, or a telephone network.

According to various example embodiments, the antenna assistant device (or the antenna assistant circuit) may be electrically connected to the above-described at least one communication module. For example, the electronic device 2000 may include at least one antenna assistant device that is connected to at least one of a Wi-Fi communication module, a Bluetooth module, and a cellular communication module. The antenna assistant devices connected to the communication modules, for example, may have different areas of capacitors or different numbers of capacitors, different extents or thicknesses of floating metals, or different extents of inductor modules. According to an example embodiment, an antenna assistant device connected to a communication module that operates a relatively high frequency band may include a relatively large floating metal and a relatively large inductor module. According to an example embodiment, an antenna assistant device connected to a communication module that operates a relatively low frequency band may include a relatively small floating metal and a relatively small inductor module.

Each of the first and second external electronic devices 2002 and 2004 may be the same as or different device from the electronic device 2001. According to an example embodiment, the server 2006 may include a group of one or more servers. According to various example embodiments, all or some of operations executed in the electronic device 2001 may be executed in another electronic device or a plurality of electronic devices (e.g., the first external electronic device 2002, the second external electronic device 2004, or the server 2006). According to an example embodiment, if the electronic device 2001 should perform any function or service automatically or according to a request, it may request another device (e.g., the first external electronic device 2002, the second external electronic device 2004, or the server 106) to perform at least part of the function or service, rather than executing the function or service for itself or in addition to the function or service. The other electronic device (e.g., the first external electronic device 2002, the second external electronic device 2004, or the server 2006) may execute the requested function or the added function and may transmit the executed result to the electronic device 2001. The electronic device 2001 may process the received result without change or additionally and may provide the requested function or service. For this purpose, for example, cloud computing technologies, distributed computing technologies, or client-server computing technologies may be used.

Figure 21:
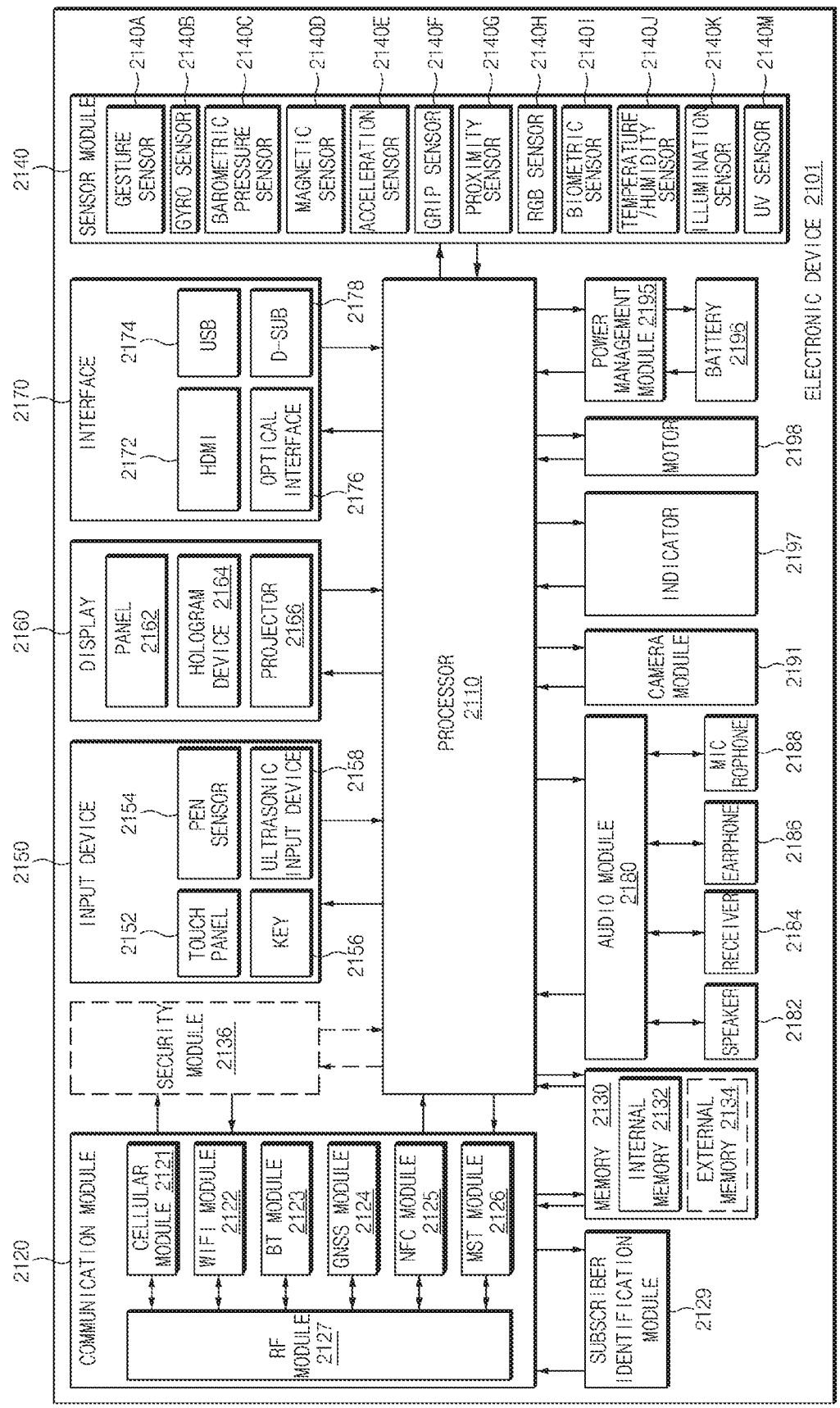
FIG. 21 is a block diagram illustrating an example electronic device according to various example embodiments.

FIG. 21 is a block diagram illustrating an example electronic device according to various example embodiments.

An electronic device 2100, for example, may include the whole part or a portion of the electronic device 100 and 1200 of FIG. 1A or FIG. 20. Referring to FIG. 21, the electronic device 2100 may include at least one processor (e.g., including processing circuitry such as an application processor (AP)) 2110, a communication module (e.g., including communication circuitry) 2120, a subscriber identification module 2129, a memory 2130, a security module 2136, a sensor module 2140, an input device (e.g., including input circuitry) 2150, a display 2160, an interface (e.g., including interface circuitry) 2170, an audio module 2180, a camera module 2191, a power management module 2195, a battery 2196, an indicator 2197, or a motor 2198.

The processor 2110 may include various processing circuitry and drive, for example, an operating system (OS) or an application program to control a plurality of hardware or software components connected thereto and may process and compute a variety of data. The processor 2110 may be implemented with, for example, a system on chip (SoC). According to an example embodiment, the processor 2110 may include a graphic processing unit (GPU) (not shown) and/or an image signal processor (not shown). The processor 2110 may include at least some (e.g., a cellular module 2121) of the components shown in FIG. 21. The processor 2110 may load a command or data received from at least one of other components (e.g., a non-volatile memory) into a volatile memory to process the data and may store various data in a non-volatile memory.

The communication module 2120 may have the same or similar configuration to a communication interface 2070 of FIG. 20. The communication module 2120 may include various communication circuitry, such as, for example, and without limitation, the cellular module 2121, a wireless-fidelity (Wi-Fi) module 2122, a Bluetooth (BT) module 2123, a global navigation satellite system (GNSS) module 2124 (e.g., a GPS module, a Glonass module, a Beidou module, or a Galileo module), a near field communication (NFC) module 2125, an MST module 2126, and a radio frequency (RF) module 2127.

An antenna assistant device may be connected to at least one of the above-mentioned communication module 2120. A capacitance of a capacitor module, an inductance of an inductor module, and the like of the connected antenna assistant device may correspond to a frequency band managed by the corresponding communication module or may be adjusted.

According to various example embodiments, the electronic device may become slimmed based on the antenna assistant device having a simpler structure, may be applied to various antenna structures, and may secure a necessary antenna performance.

The cellular module 2121 may provide, for example, a voice call service, a video call service, a text message service, or an Internet service, and the like through a communication network. According to an example embodiment, the cellular module 2121 may identify and authenticate the electronic device 2101 in a communication network using the SIM 2129 (e.g., a SIM card). According to an example embodiment, the cellular module 2121 may perform at least part of functions which may be provided by the processor 2110. According to an example embodiment, the cellular module 2121 may include a communication processor (CP).

The Wi-Fi module 2122, the BT module 2123, the GNSS module 2124, the NFC module 2125, or the MST module 2126 may include, for example, a processor for processing data transmitted and received through the corresponding module. According to various embodiments, at least some (e.g., two or more) of the cellular module 2121, the Wi-Fi module 2122, the BT module 2123, the GNSS module 2124, the NFC module 2125, or the MST module 2126 may be included in one integrated chip (IC) or one IC package.

The RF module 2127 may transmit and receive, for example, a communication signal (e.g., an RF signal). Though not shown, the RF module 2127 may include, for example, a transceiver, a power amplifier module (PAM), a frequency filter, or a low noise amplifier (LNA), or an antenna, and the like. According to another embodiment, at least one of the cellular module 2121, the Wi-Fi module 2122, the BT module 2123, the GNSS module 2124, the NFC module 2125, or the MST module 2126 may transmit and receive an RF signal through a separate RF module.

The SIM 2129 may include, for example, a card which includes a SIM and/or an embedded SIM. The SIM 2129 may include unique identification information (e.g., an integrated circuit card identifier (ICCID)) or subscriber information (e.g., an international mobile subscriber identity (IMSI)).

The memory 2130 (e.g., a memory 2030 of FIG. 20) may include, for example, an embedded memory 2132 and/or an external memory 2134. The embedded memory 2132 may include at least one of, for example, a volatile memory (e.g., a dynamic random access memory (DRAM), a static RAM (SRAM), a synchronous dynamic RAM (SDRAM), and the like), or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory, and the like), a hard drive, or a solid state drive (SSD)).

The external memory 2134 may include a flash drive, for example, a compact flash (CF), a secure digital (SD), a micro-SD, a mini-SD, an extreme digital (xD), a multimedia car (MMC), or a memory stick, and/or the like. The external memory 2134 may operatively and/or physically connect with the electronic device 2101 through various interfaces.

The security module 2136 may be a module which has a relatively higher secure level than the memory 2130 and may be a circuit which stores secure data and guarantees a protected execution environment. The secure module 2136 may be implemented with a separate circuit and may include a separate processor. The security module 2136 may include, for example, an embedded secure element (eSE) which is present in a removable smart chip or a removable SD card or is embedded in a fixed chip of the electronic device 2101. Also, the secure module 2136 may be driven by an OS different from the OS of the electronic device 2101. For example, the secure module 2136 may operate based on a Java card open platform (JCOP) OS.

The sensor module 2140 may measure, for example, a physical quantity or may detect an operation state of the electronic device 2101, and may convert the measured or detected information to an electrical signal. The sensor module 2140 may include at least one of, for example, a gesture sensor 2140A, a gyro sensor 2140B, a barometer (e.g., barometric pressure) sensor 2140C, a magnetic sensor 2140D, an acceleration sensor 2140E, a grip sensor 2140F, a proximity sensor 2140G, a color sensor 2140H (e.g., red, green, blue (RGB) sensor), a biometric sensor 2140I, a temperature/humidity sensor 2140J, an illumination sensor 2140K, or an ultraviolet (UV) sensor 2140M. Additionally or alternatively, the sensor module 2140 may further include, for example, an e-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), and/or a fingerprint sensor (not shown), and the like. The sensor module 2140 may further include a control circuit for controlling at least one or more sensors included therein. According to various embodiments, the electronic device 2101 may further include a processor configured to control the sensor module 2140, as part of the processor 2110 or to be independent of the processor 2110. While the processor 2110 is in a sleep state, the electronic device 2101 may control the sensor module 2140.

The input device 2150 may include various input circuitry, such as, for example, and without limitation, a touch panel 2152, a (digital) pen sensor 2154, a key 2156, or an ultrasonic input device 2158. The touch panel 2152 may use at least one of, for example, a capacitive type, a resistive type, an infrared type, or an ultrasonic type. Also, the touch panel 2152 may further include a control circuit. The touch panel 2152 may further include a tactile layer and may provide a tactile reaction to a user.

The (digital) pen sensor 2154 may be, for example, part of the touch panel 2152 or may include a separate sheet for recognition. The key 2156 may include, for example, a physical button, an optical key, or a keypad. The ultrasonic input device 2158 may allow the electronic device 2101 to detect a sound wave using a microphone (e.g., a microphone 2188) and to verify data through an input tool generating an ultrasonic signal.

The display 2160 (e.g., a display 2060 of FIG. 20) may include a panel 2162, a hologram device 2164, or a projector 2166. The panel 2162 may include the same or similar configuration to the display 160 or 2060. The panel 2162 may be implemented to be, for example, flexible, transparent, or wearable. The panel 2162 and the touch panel 2152 may be integrated into one module. The hologram device 2164 may show a stereoscopic image in a space using interference of light. The projector 2166 may project light onto a screen to display an image. The screen may be positioned, for example, inside or outside the electronic device 2101. According to an embodiment, the display 2160 may further include a control circuit for controlling the panel 2162, the hologram device 2164, or the projector 2166.

The interface 2170 may include various interface circuitry, such as, for example, and without limitation, a high-definition multimedia interface (HDMI) 2172, a universal serial bus (USB) 2174, an optical interface 2176, or a D-subminiature 2178. The interface 2170 may be included in, for example, a communication interface 170 or 2070 shown in FIG. 2 or 20. Additionally or alternatively, the interface 2170 may include, for example, a mobile high definition link (MHL) interface, an SD card/multimedia card (MMC) interface, or an infrared data association (IrDA) standard interface.

The audio module 2180 may convert a sound and an electric signal in dual directions. At least part of components of the audio module 2180 may be included in, for example, an input and output interface 2050 (or a user interface) shown in FIG. 20. The audio module 2180 may process sound information input or output through, for example, a speaker 2182, a receiver 2184, an earphone 2186, or the microphone 2188, and the like.

The camera module 2191 may be a device which captures a still image and a moving image. According to an embodiment, the camera module 2191 may include one or more image sensors (not shown) (e.g., a front sensor or a rear sensor), a lens (not shown), an image signal processor (ISP) (not shown), or a flash (not shown) (e.g., an LED or a xenon lamp).

The power management module 2195 may manage, for example, power of the electronic device 2101. According to an embodiment, though not shown, the power management module 2195 may include a power management integrated circuit (PMIC), a charger IC or a battery or fuel gauge. The PMIC may have a wired charging method and/or a wireless charging method. The wireless charging method may include, for example, a magnetic resonance method, a magnetic induction method, or an electromagnetic method, and the like. An additional circuit for wireless charging, for example, a coil loop, a resonance circuit, or a rectifier, and the like may be further provided. The battery gauge may measure, for example, the remaining capacity of the battery 2196 and voltage, current, or temperature thereof while the battery 2196 is charged. The battery 2196 may include, for example, a rechargeable battery or a solar battery.

The indicator 2197 may display a specific state of the electronic device 2101 or part (e.g., the processor 2110) thereof, for example, a booting state, a message state, or a charging state, and the like. The motor 2198 may convert an electric signal into mechanical vibration and may generate vibration or a haptic effect, and the like. Though not shown, the electronic device 2101 may include a processing unit (e.g., a GPU) for supporting a mobile TV. The processing unit for supporting the mobile TV may process media data according to standards, for example, a digital multimedia broadcasting (DMB) standard, a digital video broadcasting (DVB) standard, or a MediaFlo™ standard, and the like.

Each of the above-mentioned elements of the electronic device according to various example embodiments of the present disclosure may be configured with one or more components, and names of the corresponding elements may be changed according to the type of the electronic device. The electronic device according to various example embodiments of the present disclosure may include at least one of the above-mentioned elements, some elements may be omitted from the electronic device, or other additional elements may be further included in the electronic device. Also, some of the elements of the electronic device according to various example embodiments of the present disclosure may be combined with each other to form one entity, thereby making it possible to perform the functions of the corresponding elements in the same manner as before the combination.

The terminology "module" used herein may mean, for example, a unit including one of hardware, software, and firmware or two or more combinations thereof. The terminology "module" may be interchangeably used with, for example, terminologies "unit", "logic", "logical block", "component", or "circuit", and the like. The "module" may be a minimum unit of an integrated component or a part thereof. The "module" may be a minimum unit performing one or more functions or a part thereof. The "module" may be mechanically or electronically implemented. For example, the "module" may include at least one of a dedicated processor, a CPU, an application-specific integrated circuit (ASIC) chip, field-programmable gate arrays (FPGAs), or a programmable-logic device, which is well known or will be developed in the future, for performing certain operations. The term module used in conjunction with the capacitor module, inductor module, or the like, may be used interchangeably with the term structure.

According to various example embodiments of the present disclosure, at least part of a device (e.g., modules or the functions) or a method (e.g., operations) may be implemented with, for example, instructions stored in computer-readable storage media which have a program module. When the instructions are executed by a processor, one or more processors may perform functions corresponding to the instructions. The computer-readable storage media may be, for example, a memory.

The computer-readable storage media may include a hard disc, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a ROM, a random access memory (RAM), or a flash memory, and the like), and the like. Also, the program instructions may include not only mechanical codes compiled by a compiler but also high-level language codes which may be executed by a computer using an interpreter and the like. The above-mentioned hardware device may be configured to operate as one or more software modules to perform operations according to various example embodiments of the present disclosure, and vice versa.

Modules or program modules according to various example embodiments of the present disclosure may include at least one or more of the above-mentioned components, some of the above-mentioned components may be omitted, or other additional components may be further included. Operations executed by modules, program modules, or other components may be executed by a successive method, a parallel method, a repeated method, or a heuristic method. Also, some operations may be executed in a different order or may be omitted, and other operations may be added.

Example embodiments of the present disclosure described and illustrated in the drawings are provided as examples to describe technical content and to aid in understanding but do not limit the present disclosure. Accordingly, it should be understood that besides the example embodiments described herein, all modifications or modified forms derived based on the technical ideas of the present disclosure are included in the present disclosure as defined in the claims, and their equivalents.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

The processor may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. In addition, an artisan understands and appreciates that a "processor" or "microprocessor" may be hardware in the claimed disclosure.

What is claimed is:

1. An antenna assistant device comprising:
    a capacitor structure comprising stacked capacitor substrates, wherein at least first sides of the stacked capacitor substrates are configured to be electrically connected to an antenna, and at least second sides opposite the first sides of the stacked capacitor substrates are connected to a feeder;
    an inductor structure-disposed at a lower or upper portion of the capacitor structure, wherein one side of the inductor structure is configured to be connected to the feeder and another side of the inductor structure opposite the one side is configured to be connected to a ground; and
    a floating metal layer disposed between the capacitor structure and the inductor structure,
    wherein at least one of the capacitor structure, the inductor structure, and the floating metal layer comprises a dielectric layer of a printed circuit board;
    wherein the antenna assistant, including the capacitor structure, the inductor structure, and the floating metal layer, is configured to provide a bandwidth expanding effect.

2. The antenna assistant device of claim 1, wherein the capacitor structure comprises:
    a first capacitor stack comprising a plurality of capacitor substrates electrically connected to each other, each of the plurality of capacitor substrates having a surface, the plurality of capacitor substrates being vertically arranged to be spaced apart from each other at a specific gap;
    a second capacitor stack comprising a plurality of capacitor substrates, spaced apart from the plurality of capacitor substrates of the first capacitor stack and electrically connected to each other, each of the plurality of capacitor substrates of the second capacitor stack having a surface, the plurality of capacitor substrates of the second capacitor stack being arranged between the plurality of capacitor substrates of the first capacitor stack;
    a plurality of insulation layers that are arranged between the capacitor substrates; and
    a via hole that electrically connects at least some of the capacitor substrates.

3. The antenna assistant device of claim 2, wherein each of the first capacitor stack and the second capacitor stack comprises:
    a column formed in a via hole that vertically passes through the plurality of capacitor substrates to electrically connect the plurality of capacitor substrates.

4. The antenna assistant device of claim 2, wherein the floating metal layer comprises a metallic substrate, an upper insulation layer disposed on the substrate, and a lower insulation layer disposed under the substrate.

5. The antenna assistant device of claim 1, further comprising one or more of:
    at least one of a variable inductor electrically connected to the inductor structure or an auxiliary inductor having an inductance of a specific magnitude;
    at least one of a variable capacitor electrically connected to the capacitor structure or an auxiliary capacitor having a specific capacitance;
    a first feeding line that electrically connects the capacitor structure to the feeder;
    a second feeding line that electrically connects the inductor structure to the feeder;
    a ground line that electrically connects the inductor structure to a ground; and
    an antenna connection line that electrically connects one side of the capacitor structure to the antenna.

6. An electronic device comprising:
    a housing;
    a communication circuit disposed on one side of the housing;
    a multi-layered printed circuit board PCB disposed on one side of the housing and electrically connected to the communication circuit; and
    an antenna radiator disposed on one side of the housing or defining at least a portion of an outer surface of the housing, and electrically connected to the communication circuit and the multi-layered printed circuit board,
    wherein the multi-layered printed circuit board comprises:
    a first conductive pattern comprising stacked capacitor substrates, wherein at least first sides of the stacked capacitor substrates are configured to be electrically connected to an antenna, and at least second sides opposite the first sides of the stacked capacitor substrates are connected to a feeder;
    a second conductive pattern disposed at a lower or upper portion of the first conductive pattern, wherein one side of the second conductive pattern is configured to be connected to the feeder and another side of the second conductive pattern opposite the one side is configured to be connected to a ground; and
    a conductive plate disposed between the first conductive pattern and the second conductive pattern, wherein at least one of the first conductive pattern, the second conductive pattern, and the conductive plate comprises a dielectric layer of the multi-layered printed circuit board;

wherein the first conductive pattern, the second conductive pattern, and the conductive plate are configured to provide a bandwidth expanding effect.

7. The electronic device of claim 6, further comprising:

a first insulation layer disposed between the first conductive pattern and the conductive plate; and a second insulation layer disposed between the second conductive pattern and the conductive plate.

8. The electronic device of claim 6, wherein the conductive plate is electrically floated from another conductor in the electronic device; or wherein the conductive plate electrically or magnetically shields the first conductive pattern and the second conductive pattern.

9. The electronic device of claim 6, wherein the first conductive pattern comprises a plurality of planar conductive members disposed in a plurality of layers of the multi-layered printed circuit board.

10. The antenna assistant device of claim 1, wherein the inductor structure comprises a plurality of bent patterns.

11. The antenna assistant device of claim 10, wherein the plurality of bent patterns comprise:
meandering patterns.

12. The electronic device of claim 6, further comprising at least one of:

a connector disposed between the antenna radiator and the multi-layered printed circuit board;

a conductive pad electrically connected to the first conductive pattern; or a flexible conductive connector that is electrically connected to the antenna radiator and contacts the conductive pad.

13. The electronic device of claim 6, further comprising:
at least one ground disposed in the interior of the housing, wherein the first conductive pattern and/or the second conductive pattern is electrically connected to the at least one ground.

14. The electronic device of claim 6, wherein the multi-layered printed circuit board comprises:

a rigid printed circuit board; and a flexible printed circuit board attached to the rigid printed circuit board;

wherein any one of the first conductive pattern and the second conductive pattern is disposed in the rigid printed circuit board, and the other of the first conductive pattern and the second conductive pattern is disposed in the flexible printed circuit board.

* * * * *